US010069099B2

(12) United States Patent
Ishidai

(10) Patent No.: US 10,069,099 B2
(45) Date of Patent: Sep. 4, 2018

(54) ORGANIC ELECTROLUMINESCENCE ELEMENT

(71) Applicant: Konica Minolta Inc., Tokyo (JP)

(72) Inventor: Hiroshi Ishidai, Hachioji (JP)

(73) Assignee: KONICA MINOLTA, INC, Tokyo (JP)

( * ) Notice: Subject to any disclaimer, the term of this patent is extended or adjusted under 35 U.S.C. 154(b) by 25 days.

(21) Appl. No.: 14/895,425

(22) PCT Filed: May 15, 2014

(86) PCT No.: PCT/JP2014/062916
§ 371 (c)(1),
(2) Date: Dec. 2, 2015

(87) PCT Pub. No.: WO2014/196330
PCT Pub. Date: Dec. 11, 2014

(65) Prior Publication Data
US 2016/0111676 A1    Apr. 21, 2016

(30) Foreign Application Priority Data

Jun. 6, 2013  (JP) .................................. 2013-119615

(51) Int. Cl.
*H01L 51/52*   (2006.01)
*C09K 11/06*   (2006.01)
*H01L 51/00*   (2006.01)

(52) U.S. Cl.
CPC .......... *H01L 51/5234* (2013.01); *C09K 11/06* (2013.01); *H01L 51/0096* (2013.01);
(Continued)

(58) Field of Classification Search
CPC ............. H01L 51/5234; H01L 21/5234; H01L 21/5215; H01L 21/0096; H01L 21/0097; H01L 21/5206
See application file for complete search history.

(56) References Cited

U.S. PATENT DOCUMENTS

2004/0135503 A1* 7/2004 Handa ................. H01L 51/0096
313/511
2008/0138538 A1* 6/2008 Lewis ................. H01L 51/5253
428/1.1
(Continued)

FOREIGN PATENT DOCUMENTS

JP    2003077680 A    3/2003
JP    2004146379 A    5/2004
(Continued)

OTHER PUBLICATIONS

International Search Report dated Aug. 26, 2014 for PCT/JP2014/062916 and English translation.

*Primary Examiner* — Douglas Menz
(74) *Attorney, Agent, or Firm* — Lucas & Mercanti, LLP

(57) ABSTRACT

An object of the present invention is to provide a two-sided light emission-type transparent organic electroluminescence element that has flexibility, has a small viewing angle dependence of chromaticity, and can easily adjust the light-emission balance of the two sides. The organic electroluminescence element of the present invention is characterized by being comprised by at least a transparent substrate, a first transparent electrode, an organic light-emitting layer, a second transparent electrode and a transparent sealing substrate, wherein both of the transparent substrate and the transparent sealing substrate have flexibility and are comprised by material(s) selected from an identical group of materials, and the first transparent electrode and the second transparent electrode are comprised by material(s) selected from an identical group of materials.

17 Claims, 2 Drawing Sheets

(52) U.S. Cl.
CPC ........ *H01L 51/0097* (2013.01); *H01L 51/524* (2013.01); *H01L 51/5206* (2013.01); *H01L 51/5215* (2013.01); *H01L 51/5253* (2013.01); *C09K 2211/1011* (2013.01); *C09K 2211/1029* (2013.01); *C09K 2211/1044* (2013.01); *C09K 2211/185* (2013.01); *H01L 2251/301* (2013.01); *H01L 2251/5323* (2013.01); *H01L 2251/5338* (2013.01); *H01L 2251/558* (2013.01)

(56) References Cited

U.S. PATENT DOCUMENTS

| | | | |
|---|---|---|---|
| 2011/0134087 A1* | 6/2011 | Moriwaki | G09G 3/20 345/204 |
| 2011/0139253 A1* | 6/2011 | Wachi | H01L 51/442 136/263 |
| 2012/0248970 A1* | 10/2012 | Okuyama | H01L 51/5268 313/504 |

FOREIGN PATENT DOCUMENTS

| | | | |
|---|---|---|---|
| JP | 2004265691 A | | 9/2004 |
| JP | 2010505246 A | | 2/2010 |
| JP | 2010232099 A | | 10/2010 |
| JP | 2011077028 A | | 4/2011 |
| JP | 2013242988 A | | 12/2013 |
| WO | 2013073356 A1 | | 5/2013 |

* cited by examiner

ORGANIC ELECTROLUMINESCENCE ELEMENT

CROSS REFERENCE TO RELATED APPLICATION

This Application is a 371 of PCT/JP2014/062916 filed on May 15, 2014 which, in turn, claimed the priority of Japanese Patent Application No. JP2013-119615 filed on Jun. 6, 2013, both applications are incorporated herein by reference.

TECHNICAL FIELD

The present invention relates to an organic electroluminescence element. More specifically, the present invention relates to an organic electroluminescence element that is a two-sided light emission-type transparent organic electroluminescence element, has flexibility, has low viewing angle dependence of chromaticity, and can easily adjust the light-emission balance of the two sides.

BACKGROUND ART

Currently, light-emitting elements utilizing the electro luminescence (Electro Luminescence: EL) of organic materials gain attention as thin-type light-emitting materials.

A so-called organic electro luminescence element (hereinafter also referred to as an organic EL element) is a thin film-type, completely solid element capable of emitting light at a low voltage of about several volts to several ten volts, and has many excellent characteristics such as a high luminance, a high light emission efficiency, a thin type and a light weight. Therefore, organic EL elements gain attentions as surface light-emitting bodies for backlights for various displays, display boards such as signboards and emergency lights, and illumination light sources.

Such organic EL elements each has a constitution in which a light-emitting layer formed of an organic material is disposed between two electrodes, and the emitted light generated in the light-emitting layer goes through the electrodes and is extracted outside. Therefore, at least one of the two electrodes is constituted as a transparent electrode, and the emitted light is extracted from the side of the transparent electrode.

On the other hand, demands for substantially transparent organic EL elements capable of emitting light from two sides have been increased in view of high design property and the like. Furthermore, organic EL elements capable of emitting light from two sides having flexibility and a light weight have been required.

It was a conventional problem that, in the case when the upper side electrode that is on the position far from a substrate of an organic EL element among two electrodes on the substrate is comprised by a transparent material and hollow sealing is conducted, reflection occurs at the interface between the electrode and the sealed space, and the side of the lower electrode emits light more strongly, and the viewing angle dependence of chromaticity is so high that the shade differs depending on the angle of observation.

Furthermore, there was also a problem that the freeness of the design of the light emission states of the two sides is not high, since the light emission states of the substrate side and the sealing side are restricted due to the difference in the materials and layer thicknesses of the two electrodes on the upper part and lower part, the difference in the materials of the substrate and the sealing material, and the like.

Furthermore, in the case of a flexible substrate, when the organic EL element has a formed of a curved surface, regions having different viewing angles are generated in the same element panel surface even seen from the same place. Therefore, the above-mentioned viewing angle dependence of chromaticity becomes more significant, and thus a light emitting property in accordance with the Lambert distribution is required.

The above-mentioned viewing angle dependency is improved to some extent by using a light extraction sheet having a light scattering property. However, use of a light extraction sheet is not necessarily preferable in view of transparency, and it is preferable that the element itself has a light emitting property in accordance with the Lambert distribution.

As an organic EL element capable of emitting light from two sides, Patent Literature 1 has attained light emission from two sides by attaching two organic EL elements formed on transparent substrates so that the transparent substrates are positioned on the outer sides with each other, but the elements themselves are not transparent since the emitted lights are extracted from the sides of the transparent substrates. Furthermore, the layer thickness is thick due to the attaching, and thus there are problems in view of cost and producibility.

An object of Patent Literature 2 is to obtain an image display having even color tones of the emission of light toward the upper surface and the emission of light toward the lower surface and a high quality, by adjusting the layer thickness of a transparent electroconductive film disposed on the side of a cathode and the layer thickness of the cathode. However, since the element has an airspace inside, reflection occurs at the interface of the above-mentioned electrode and the sealed space, and thus there are problems that the side of the lower electrode emits light more strongly and thus even light emission from the two sides is impossible as mentioned above, and that the above-mentioned viewing angle dependence of chromaticity is also significant.

Patent Literature 3 discloses about a two-sided light emission-type organic EL element that can radiate emitted lights having different light properties from the two sides of the element, but does not explain in detail about the substrate, electrodes and sealing material. Furthermore, since the element has an airspace inside, and a wavelength converting material, scattering particles and the like are added to one of the electrodes, it is considered that the transparency is low, and the viewing angle dependence of chromaticity is significant.

Accordingly, under the current situation, a two-sided light emission-type organic electroluminescence element that is transparent, has flexibility, has a small viewing angle dependence of chromaticity, and can easily adjust the light-emission balance of the two sides has not been obtained.

CITATION LIST

Patent Literatures

Patent Literature 1: JP 2010-232099 A
Patent Literature 2: JP 2004-265691 A
Patent Literature 3: JP 2010-505246 T

SUMMARY OF INVENTION

Technical Problem

The present invention has been made in view of the above-mentioned problems and circumstances, and the problem to be solved by the invention is to provide a two-sided light emission-type organic electroluminescence element that is transparent, has flexibility, has a small viewing angle dependence of chromaticity, and can easily adjust the light-emission balance of the two sides.

Solution to Problem

The present inventors have considered about the causes of the above-mentioned problems, and the like so as to solve the above-mentioned problems, and found that a two-sided light emission-type organic electroluminescence element that is transparent, has flexibility, has a small viewing angle dependence of chromaticity, and can easily adjust the light-emission balance of the two sides can be provided by an organic electroluminescence element that has a transparent substrate and a transparent sealing substrate both having flexibility and are comprised by material(s) selected from an identical group of materials, and has a first transparent electrode and a second transparent electrode that are comprised by material(s) selected from an identical group of materials, and attained the present invention.

Specifically, the above-mentioned problem of the present invention is solved by the following means.

1. An organic electroluminescence element comprised by at least a transparent substrate, a first transparent electrode, an organic light-emitting layer, a second transparent electrode and a transparent sealing substrate, wherein both of the transparent substrate and the transparent sealing substrate have flexibility and are comprised by material(s) selected from an identical group of materials, and the first transparent electrode and the second transparent electrode are comprised by material(s) selected from an identical group of materials.

2. The organic electroluminescence element according to Item. 1, wherein both of the first transparent electrode and the second transparent electrode contain silver or an alloy containing silver as a major component.

3. The organic electroluminescence element according to Item. 1 or 2, including transparent functional layers containing an organic or inorganic compound, between the transparent substrate and the first transparent electrode, and between the second transparent electrode and the transparent sealing substrate.

4. The organic electroluminescence element according to Item. 3, wherein at least one layer of the transparent functional layer is a primer layer containing an organic compound having at least one kind of atom selected from a nitrogen atom and a sulfur atom.

5. The organic electroluminescence element according to Item. 3, wherein at least one layer of the transparent functional layer is an electrode protective layer.

6. The organic electroluminescence element according to any one of Items. 1 to 5, wherein the layer thicknesses of the first transparent electrode and the second transparent electrode are each in the range of from 5 to 30 nm.

7. The organic electroluminescence element according to any one of Items. 1 to 6, wherein the entirety of the first transparent electrode, the organic light-emitting layer and the second transparent electrode disposed on the transparent substrate is sealed by lamination by the transparent sealing substrate.

8. The organic electroluminescence element according to any one of Items. 1 to 7, wherein when the distance between the first transparent electrode and the light-emitting center of the organic light-emitting layer is deemed as a and the distance between second transparent electrode and the light-emitting center of the organic light-emitting layer is deemed as b, the ratio a:b is in the range of from 3:5 to 5:3.

Advantageous Effects of Invention

According to the above-mentioned means of the present invention, a two-sided light emission-type organic electroluminescence element that is transparent, has flexibility, has a small viewing angle dependence of chromaticity, and can easily adjust the light-emission balance of the two sides can be provided.

The mechanism of expression of the effect and the action mechanism of the present invention have not been clarified, but are conjectured as follows.

Since the organic EL element of the present invention is comprised by at least a transparent substrate having flexibility, a first transparent electrode, an organic light-emitting layer, a second transparent electrode, and a transparent sealing substrate having flexibility, and the transparent substrate and transparent sealing substrate are comprised by material(s) selected from an identical group of materials, and the first transparent electrode and second transparent electrode are comprised by material(s) selected from an identical group of materials. Therefore, since the materials that control emitted light have approximately identical properties at the two sides of the organic light-emitting layer, approximately identical light emitting properties can be obtained on the two sides without depending on the design of the organic light-emitting layer. Specifically, if the first transparent electrode and second transparent electrode are electrodes containing silver or an alloy containing silver as a major component, the electrodes can be adjusted to be films that are thin to the extent that mirror surface reflection does not occur on the metal electrodes as compared to indium tin oxide ($SnO_2$—$In_2O_3$:Indium Tin Oxide:ITO) electrodes that have been known as transparent electrodes since before, and thus it is not necessary to consider the loss of the light due to the mirror surface reflection, and the light emission luminances of the two sides can be optionally preset. Furthermore, it is considered that, since the electrodes are thin films, there is no problem of cracks of the electrodes which easily occur when the electrodes are bent.

Furthermore, since the organic EL element of the present invention is laminate-sealed by a transparent sealing substrate having flexibility, it is conjectured that reflection at the interface of the electrode and the sealed space, and a cavity effect occur little as compared to a sealing having a hollow part, and the viewing angle dependence of chromaticity can also be suppressed.

DESCRIPTION OF EMBODIMENTS

Figure 1:
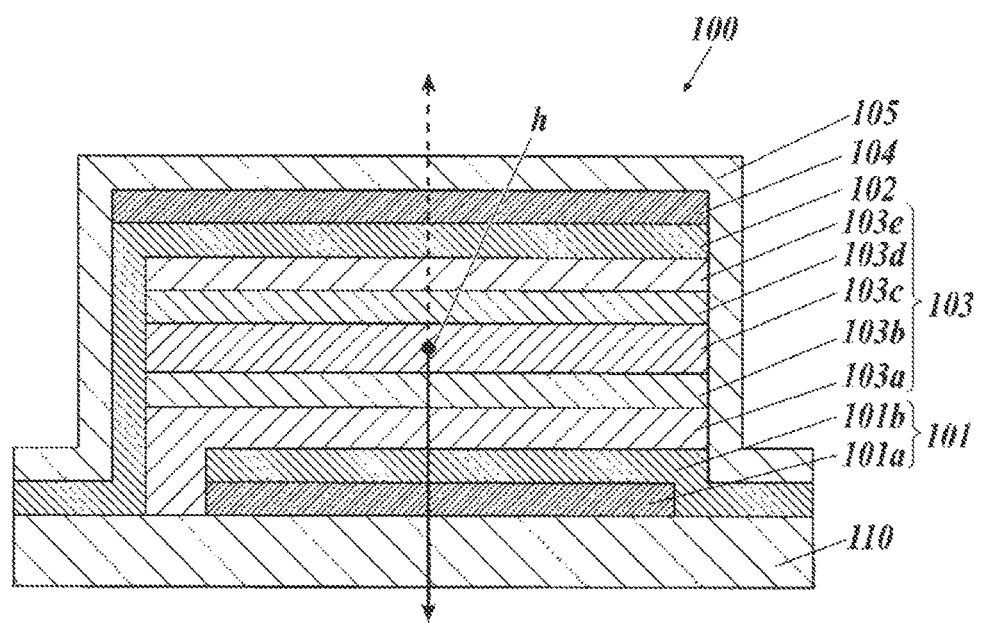
FIG. 1 is a schematic drawing showing an example of the constitution of the organic EL element of the present invention.

The organic electroluminescence element of the present invention is characterized by being comprised by at least a transparent substrate, a first transparent electrode, an organic light-emitting layer, a second transparent electrode and a transparent sealing substrate, wherein both of the transparent substrate and the transparent sealing substrate have flexibility and are comprised by material(s) selected from an identical group of materials, and the first transparent electrode and the second transparent electrode are comprised by material(s) selected from an identical group of materials. This characteristic is a technical feature that is common in the inventions as claimed in claims 1 to 8.

As an embodiment of the present invention, in view of expression of the effect of the present invention, it is preferable that both of the first transparent electrode and the second transparent electrode are electrodes containing silver or an alloy containing silver as a major component, since the electrodes can be adjusted to be films that are thinner than conventional transparent electrodes, and are thin films having no problem of generation of cracks when they are bent, and mirror surface reflection on metal electrodes does not occur, and thus the viewing angle dependence of chromaticity can be decreased and the light emission luminances of the two side can be optionally preset.

Furthermore, it is preferable to include transparent functional layers each containing an organic or inorganic compound between the transparent substrate and the first transparent electrode, and the second transparent electrode and the transparent sealing substrate.

It is a preferable embodiment that at least one layer of the transparent functional layers is a primer layer containing an organic compound having at least one kind of atom selected from a nitrogen atom and a sulfur atom, since the aggregation of the silver or alloy containing silver as a major component that forms the electrodes is suppressed, and the electrode layers can be formed into thin films, and thus more transparent electrodes are obtained.

Furthermore, it is a preferable embodiment that at least one layer of the transparent functional layers is an electrode protective layer, in view of the protection and smoothing of the electrode layers, and the reinforcement of the tackiness by solid adhesion with the transparent sealing substrate.

It is preferable that the first transparent electrode and the second transparent electrode have layer thicknesses that are respectively in the scope of from 5 to 30 nm, from the viewpoint that electrodes that are transparent thin films and have flexibility can be obtained. Furthermore, it is preferable since the light emission luminance of the two sides can be optionally preset by changing the layer thicknesses of the first transparent electrode and second transparent electrode.

Furthermore, since the entirety of the first transparent electrode, the organic light-emitting layer and the second transparent electrode disposed on the transparent substrate are laminate-sealed by the transparent sealing substrate, the reflection at the interface of the electrode and the sealed space in the case when sealing having a hollow part is conducted is eliminated, and thus a two-sided light emission-type organic electroluminescence element having small angle dependence of chromaticity can be obtained.

Furthermore, it is preferable that, when the distance between the first transparent electrode and the light-emitting center of the organic light-emitting layer is deemed as a and the distance between second transparent electrode and the light-emitting center of the organic light-emitting layer is deemed as b, the ratio a:b is in the range of from 3:5 to 5:3, from the viewpoints that, if the layer thickness of the organic light-emitting layer deviates in the process of designing, the light emitting properties of the two sides can be unified, and the viewing angle dependence of chromaticity is decreased more.

Hereinafter the present invention and the constitutional elements thereof, and the forms and embodiments for carrying out the present invention will be explained in detail. In the present application, "to" is used to mean that the numerical values described before and after the term are encompassed as the lower limit value and upper limit value. In addition, "organic electroluminescence element" will be explained below as "organic EL element".

<Summary of Organic EL Element of Present Invention>

The organic EL element of the present invention is characterized by being comprised by at least a transparent substrate, a first transparent electrode, an organic light-emitting layer, a second transparent electrode and a transparent sealing substrate, wherein both of the transparent substrate and the transparent sealing substrate have flexibility and are comprised by material(s) selected from an identical group of materials, and the first transparent electrode and the second transparent electrode are comprised by material(s) selected from an identical group of materials, and provides a two-sided light emission-type organic electroluminescence element that is transparent, has flexibility, has a small viewing angle dependence of chromaticity, and can easily adjust the light-emission balance of the two sides by such constitution.

The characteristic is such that both the transparent substrate and the transparent sealing substrate have flexibility, and "flexibility" as used herein refers to that, when a substrate plate or a substrate is wound around a roll with a diameter of 50 mm and rewound under a predetermined tension, cracking and the like do not occur. In the present invention, it is preferable to use a substrate plate or a substrate that can be wound around a roll with a diameter of 30 mm. It is preferable to use the resin material mentioned below.

Furthermore, "transparent" as referred to in the present invention means that, when the light transmittances (%) at a light wavelength of 550 nm of the above-mentioned substrate plate, substrate, electrodes and light-emitting layer are respectively measured by using a spectrometer (U-3300 manufactured by Hitachi High-Technologies Corporation), the substrate plate, substrate, electrodes and light-emitting layer have light transmittances of 50% or more. The light transmittance of each element that constitutes the organic EL element is preferably 60% or more, more preferably 70% or more, specifically preferably 80% or more.

The organic EL element of the present invention is of a two-sided light emission-type, and in order to respond to the request for design property mentioned above, the light transmittance at a light wavelength of 550 nm of the entirety of the organic EL element is preferably 50% or more. The light transmittance is preferably 60% or more.

<Details of Organic EL Element of Present Invention>

[Constitution of Organic EL Element]

The organic EL element of the present invention may have various constitutions, and an example is shown in FIG. 1. However, the present invention is not limited to this.

In FIG. 1, the case when a resin substrate is used as the substrate used in the organic EL element will be explained.

The organic EL element 100 of the present invention is disposed on a transparent substrate 110, and is comprised by stacking at least a first transparent electrode 101, an organic light-emitting layer 103, which is comprised by using an organic material and the like, a second transparent electrode (counter electrode) 102 and a transparent sealing substrate 105 in this order from the side of the transparent substrate 110. The end part of the first transparent electrode 101 (an electrode layer 101b) has a shape of an extraction electrode, and the first transparent electrode 101 and an external power source (illustration is abbreviated) are electrically connected through an extraction electrode. The organic EL element 100 is constituted so that generated light (emitted light h) is extracted from the side of the transparent substrate 110 and the side of the transparent sealing substrate 105.

It is necessary that the organic EL element 100 of the present invention is comprised by at least a transparent substrate, a first transparent electrode, an organic light-emitting layer, a second transparent electrode and a transparent sealing substrate, wherein both of the transparent substrate and the transparent sealing substrate have flexibility and are comprised by material(s) selected from an identical group of materials, and the first transparent electrode and the second transparent electrode are comprised by material(s) selected from an identical group of materials.

That "comprised by material(s) selected from an identical group of materials" means that the transparent substrate and the transparent sealing substrate, and the first transparent electrode and the second transparent electrode are respectively comprised by material(s) selected from the following identical group of materials as the major component. "Major component" refers to a component that accounts for 80 mass % or more, more preferably 90 mass % or more as the component of the material that constitutes the transparent substrate and the transparent sealing substrate, and the first transparent electrode and the second transparent electrode.

Furthermore, the layer structure of the organic EL element 100 is not limited and may be a general layer structure. It is deemed herein that the first transparent electrode 101 functions as an anode (i.e., an anode) and the second transparent electrode 102 functions as a cathode (i.e., a cathode). In this case, for example, as the organic light-emitting layer 103, a constitution in which a hole injection layer 103a/a hole transport layer 103b/a light-emitting layer 103c/an electron transport layer 103d/an electron injection layer 103e are stacked in this order from the side of the first transparent electrode 101 as an anode is exemplified, and it is essential to have at least the light-emitting layer 103c comprised by using an organic material among these layers. The hole injection layer 103a and hole transport layer 103b may also be disposed as a hole transport-injection layer. The electron transport layer 103d and electron injection layer 103e may also be disposed as an electron transport-injection layer. Furthermore, among these light-emitting units 103, for example, the electron injection layer 103e may be comprised by an inorganic material.

Furthermore, a hole blocking layer, an electron blocking layer and the like may be stacked on necessary positions as necessary besides these layers in the light-emitting unit 103. Furthermore, the light-emitting layer 103c may have a structure having light-emitting layers of respective colors that generate emitted lights in the respective wavelength areas, wherein these light-emitting layers are stacked via non-light-emitting intermediate layers. The intermediate layers may function as hole blocking layers or electron blocking layers. Furthermore, the second transparent electrode 102, which is a cathode, may have a stacked structure as necessary. In such constitution, only the part where the organic light-emitting layer 103 is sandwiched between the first transparent electrode 101 and the second transparent electrode 102 becomes a light-emitting area in the organic EL element 100.

Furthermore, in the layer constitution as mentioned above, an auxiliary electrode (not depicted) may be disposed in contact with the electrode layer 101b of the first transparent electrode 101 for the purpose of aiming at decreasing the resistance of the first transparent electrode 101.

The organic EL element 100 having the constitution as mentioned above is sealed with the transparent sealing substrate 105 on the transparent substrate 110, for the purpose of preventing the deterioration of the organic light-emitting layer 103, which is comprised by an organic material and the like. This transparent sealing substrate 105 is fixed on the side of the transparent substrate 110 through an adhesive on the surface thereof. However, the extraction electrode part of the first transparent electrode 101 and the terminal part of the second transparent electrode 102 are disposed in the state that they are exposed from the transparent sealing substrate 105 in the state that the insulation property is retained from each other by the organic light-emitting layer 103 on the transparent substrate 110.

Furthermore, it is preferable that the transparent substrate 110 and the transparent sealing substrate 105 have a gas barrier layer so as to protect the organic light-emitting layer 103 from the humidity in the external environment and the like.

Furthermore, it is preferable that, when the distance between the first transparent electrode and the light-emitting center of the light-emitting center is deemed as a and the distance between second transparent electrode and the light-emitting center of the light-emitting center is deemed as b, the ratio a:b is in the range of from 3:5 to 5:3, for easy adjustment of the light-emission balance of the two sides. Within this range, the difference of the light emitting properties of the two sides is small even in the case when the layer thickness of the organic light-emitting layer deviates by designing and the light-emitting center transfers. The ratio a:b is more preferably within the range of from 2:3 to 3:2.

The above-mentioned distance a refers to the distance from the surface of the first transparent electrode on the side of the organic light-emitting layer to the light-emitting center (generally the center of the light-emitting layer) of the organic light-emitting layer, and the distance b refers to the distance from the surface of the second transparent electrode on the side of the organic light-emitting layer to the light-emitting center (generally the center of the light-emitting layer) of the organic light-emitting layer.

[Method for Producing Organic EL Element]

The method for producing the organic EL element of the present invention is preferably conducted by stacking at least a first transparent electrode, an organic light-emitting layer and a second transparent electrode on a transparent substrate, and further sealing these by laminating with a transparent sealing substrate.

As an example, the method for producing the organic EL element 100 shown in FIG. 1 will be explained here as an example.

<Stacking Step>

In the method for producing the organic EL element of the present invention, at least a first transparent electrode 101, an organic light-emitting layer 103 and a second transparent electrode 102 are stacked on a transparent substrate 110, and are further laminated with a transparent sealing substrate 105.

It is preferable to have transparent functional layers each containing an organic or inorganic compound between the transparent substrate and the first transparent electrode, and between the second transparent electrode and the transparent sealing substrate.

Firstly, the transparent substrate 110 is prepared, and for example, a primer layer 101a formed of a nitrogen-containing compound containing a nitrogen atom is formed on the transparent substrate 110 as a transparent functional layer by a suitable method such as a deposition process so as to give a layer thickness within the range of 1 µm or less, preferably from 10 to 100 nm.

Secondly, an electrode layer 101*b* formed of silver or an alloy containing silver as a major component is formed on the primer layer 101*a* so as to have a layer thickness within the range of 30 nm or less, preferably from 5 to 30 nm by a suitable method such as a deposition process, thereby the first transparent electrode 101 that serves as an anode is prepared. Simultaneously, an extraction electrode unit, which is connected to an external power source, is formed on the end part of the first transparent electrode 101 by a suitable method such as a deposition process.

Secondly, the hole injection layer 103*a*, the hole transport layer 103*b*, the light-emitting layer 103*c*, the electron transport layer 103*d* and the electron injection layer 103*e* are stacked thereon in this order, whereby the organic light-emitting layer 103 is formed.

A spin coating process, a casting process, an inkjet process, a vacuum deposition process, a printing process and the like are exemplified for the formation of these respective layers, and a vacuum deposition process or a spin coating process is specifically preferable since homogeneous layers are easily obtained and pinholes are difficult to generate. Furthermore, different film formation processes may be applied to every layer. In the case when a vacuum deposition process is adopted for the film formation of these respective layers, the deposition conditions differ depending on the kinds of the compounds used, and the like, and it is generally desirable to suitably select the respective conditions within the ranges of: a boat heating temperature of from 50 to 450° C., a vacuum degree of from $1 \times 10^{-6}$ to $1 \times 10^{-2}$ Pa, a deposition velocity of from 0.01 to 50 nm/sec, a substrate temperature of from −50 to 300° C. and a layer thickness of from 0.1 to 5 µm.

After forming the organic light-emitting layer 103 as above, the second transparent electrode 102, which becomes a cathode, is formed on the upper part thereof by a suitable film formation process such as a deposition process or a sputtering process. At this time, the second transparent electrode 102 is formed into a shape in which terminal parts are drawn from the upper side of the organic light-emitting layer 103 on the peripheral edge of the transparent substrate 110 while an insulated state against the first transparent electrode 101 is kept by the organic light-emitting layer 103.

In order to make the surface of the second transparent electrode smooth, and to protect the surface by imparting strength thereto, it is preferable to form an electrode protective layer 104 as the transparent functional layer in the present invention. It is preferable to form the electrode protective layer by a suitable method such as the above-mentioned application process or deposition process so that the layer thickness of the electrode protective layer become a layer thickness of 1 µm or less, preferably in the range of from 10 to 100 nm.

Secondly, the transparent sealing substrate 105 to which an adhesive layer has been provided is laminated on the electrode protective layer 104 and on the transparent substrate 110 by a method such as heat pressure bonding so as to cover the first transparent electrode, organic light-emitting layer and second transparent electrode, and sealing is conducted, whereby the organic EL element 100 is prepared.

The details of the major respective layers for constituting the organic EL element 100 and the production methods thereof will be further explained below.

[Transparent Substrate]

Both of the transparent substrate and the transparent sealing substrate in the present invention have flexibility and are comprised by material(s) selected from an identical group of materials. That "selected from an identical group of materials" herein refers to that the materials selected from the following group of materials are used as the resin substrates. Specifically, from the viewpoint of making the designing of two-side light emission easy, it is preferable that the transparent substrate and the transparent sealing substrate are respectively comprised by an identical material. Furthermore, if the substrates are comprised by an identical material, it is also advantageous in production costs.

Furthermore, it is preferable that the transparent substrate 110 is basically comprised by a transparent resin substrate as a substrate and one or more gas barrier layer(s) each having a refractive index at a light wavelength of 550 nm in the scope of from 1.4 to 1.7. In this case, it is preferable to use an identical material also in the formation of the gas barrier layer.

(1) Resin Substrate

The resin substrate used in the present invention is a transparent and flexible resin substrate. It is preferable that the resin substrate that is preferably used in the present invention has gas barrier performances such as humidity resistance/gas permeation resistance that are required for an organic EL element.

In the present invention, the light transmittance at a light wavelength of 550 nm of the resin substrate is preferably 70% or more, more preferably 80% or more, further preferably 90% or more.

In the present invention, the group of the materials that form the transparent resin substrate refers to acrylic resins such as acrylic acid esters, methacrylic acid esters and PMMA, respective resin films of polyethylene telephthalates (PET), polybutyrene telephthalates, polyethylene naphthalates (PEN), polycarbonates (PC), polyarylates, polyvinyl chlorides (PVC), polyethylenes (PE), polypropylenes (PP), polystyrenes (PS), nylons (Ny), aromaticpolyamides, polyetherether ketones, polysulfones, polyethersulfonates, polyimides, polyetherimides, polyolefins and epoxy resins, respective resin films of cycloolefin-based resins and cellulose ester-based resins, heat-resistant transparent films having a silsesquioxane having an organic-inorganic hybrid structure as an elemental backbone (product name: Sila-DEC, manufactured by Chisso Corporation), and resin films formed by stacking two or more layers of the above-mentioned resin materials, and the like.

As the resin substrate in the present invention, in view of costs and easiness in acquiring, polyethylene telephthalates (PET), polyethylene naphthalates (PEN), polycarbonates (PC), acrylic resins and the like are preferably used.

Among these, biaxially-drawn polyethylene telephthalate (PET) films and biaxially-drawn polyethylene naphthalate (PEN) films are preferable in view of transparency, heat resistance, easiness of handling, strength and costs.

Furthermore, low heat shrink-treated articles that have undergone treatments such as heat annealing are the most preferable so as to maximally suppress the shrinking during thermal expansion.

The thickness of the resin substrate is preferably in the range of from 10 to 500 µm, more preferably in the range of from 20 to 250 µm, and further preferably in the range of from 30 to 150 µm. Since the thickness of the resin substrate is in the range of from 10 to 500 µm, a stable gas barrier property can be obtained, and the resin substrate becomes suitable for transportation by a roll-to-roll system.

(2) Gas Barrier Layer (2.1) Property and Formation Method

In the present invention, it is preferable that one or more gas barrier layer(s) each having a refractive index measured at a light wavelength of 550 nm of from 1.4 to 1.7 is/are provided as transparent functional layer(s) to the resin substrate of the transparent substrate 110. As such gas barrier layers, known materials can be used without specific limitation, and the gas barrier layers may be coatings formed of inorganic substances or organic substances, or may be hybrid coatings including these coatings in combination.

The gas barrier layers are preferably gas barrier films (also referred to as gas barrier films and the like) each having a water vapor permeation degree measured based on the method of JIS K 7129-1992 (25±0.5° C., relative humidity 90±2% RH) of 0.01 $g/m^2 \cdot 24$ h or less. Furthermore, the gas barrier layers are preferably high gas barrier films each having an oxygen permeation degree measured based on the method of JIS K 7126-1987 of $1 \times 10^{-3}$ $ml/m^2 \cdot 24$ h·atm or less, and a water vapor permeation degree of $1 \times 10^{-5}$ $g/m^2 \cdot 24$ h or less.

The materials for forming such gas barrier layers may be any one as long as they are materials having a function to suppress the entering of substances that lead to the deterioration of the element such as water content and oxygen, and for example, silicon oxide, silicon dioxide, silicon nitride and the like can be used. Furthermore, in order to improve the brittleness of the gas barrier layer, it is possible to form a structure in which a layer formed of an organic material (an organic layer) is stacked as a stress relaxation layer on these inorganic layers. The order of the stacking of the inorganic layer and the organic layer is not specifically limited, and it is preferable to stack the two layers plural times in an alternate manner.

The method for forming the gas barrier layer is not specifically limited, and for example, a vacuum deposition process, a sputtering process, a reactive sputtering process, a molecular ray epitaxy process, a cluster ion beam process, an ion plating process, a plasma polymerization process, an atmospheric pressure plasma polymerization process, a plasma CVD process, a laser CVD process, a thermal CVD process, a coating process and the like can be used, and the method by an atmospheric pressure plasma polymerization process described in JP 2004-68143 A is preferable.

(2.2) Inorganic Precursor Compound

Furthermore, the gas barrier layer is preferably formed by applying at least one layer of an application liquid containing an inorganic precursor compound on the resin substrate.

The inorganic precursor compound used in the present invention is not specifically limited as long as it is a compound that can form a metal oxide, a metal nitride or a metal oxide nitride by irradiation of an ultraviolet ray under a specific atmosphere, and the compound that is suitable for the present invention, the compounds that can undergo a modification treatment at a relatively low temperature as described in JP 8-112879 A are preferable.

Specifically, polysiloxanes having Si—O—Si bonds (including polysilsesquioxanes), polysilazanes having Si—N—Si bonds, polysiloxazanes containing both Si—O—Si bonds and Si—N—Si bonds, and the like can be exemplified. These can be used by mixing two or more kinds. Furthermore, these can also be used by sequentially stacking or simultaneously stacking different compounds.

Among these, the polysilazanes are preferable, and polysilazanes used in the present invention are polymers having silicon-nitrogen bonds, and are inorganic precursor polymers such as intermediate solid-solutions $SiO_xN_y$ (x:0.1 to 1.9, y:0.1 to 1.3) of $SiO_2$, $Si_3N_4$ and both, which are formed of Si—N, Si—H, N—H and the like.

The polysilazanes that are preferably used in the present invention are represented by the following general formula (A).

General formula (A)

—[Si($R_1$)($R_2$)—N($R_3$)]—    General formula (A)

In the general formula (A), $R_1$, $R_2$ and $R_3$ each represents a hydrogen atom, an alkyl group, an alkenyl group, a cycloalkyl group, an aryl group, an alkylsilyl group, an alkylamino group or an alkoxy group.

In the present invention, perhydropolysilazane in which $R_1$, $R_2$ and $R_3$ are all hydrogen atoms is specifically preferable from the viewpoint of denseness.

Polysilazanes are commercially available in a state of a solution dissolved in an organic solvent, and commercially available products can be directly used as polysilazane-containing application liquids. Examples of the commercially available products of polysilazane solutions include NN120-20, NAX120-20 and NL120-20 manufactured by AZ Electronic Materials, and the like.

After the above-mentioned application liquid containing a polysilazane has been applied and dried, the application liquid can be subjected to a modification treatment by irradiating the application liquid with a vacuum ultraviolet ray.

As an organic solvent for preparing the application liquid containing polysilazane, it is preferable to avoid use of organic solvents containing alcohol-based organic solvents and organic solvents containing water content, which easily react with the polysilazane. Examples of the applicable organic solvents include hydrocarbon solvents such as aliphatic hydrocarbons, alicyclic hydrocarbons and aromatic hydrocarbons, halogenated hydrocarbon solvents, and ethers such as aliphatic ethers and alicyclic ethers can be used, and specific examples include hydrocarbons such as pentane, hexane, cyclohexane, toluene, xylene, Solvesso and terbenes, halogen hydrocarbons such as methylene chloride and trichloroethane, ethers such as dibutyl ether, dioxane and tetrahydrofuran, and the like. These organic solvents are selected depending on the purposes such as the solubility of the polysilazane and the vaporization velocity of the organic solvent, and plural organic solvents may be mixed.

The concentration of the polysilazane in the application liquid containing the polysilazane differs depending on the layer thickness of the gas barrier layer and the pot life of the application liquid, and is preferably about 0.2 to 35% by mass.

In order to promote modification to acid silicon nitride, amine catalysts, and metal catalysts such as Pt compounds such as Pt acetyl acetonate, Pd compounds such as Pd propionate and Rh compounds such as Rh acetyl acetonate can also be added to the application liquid for forming a gas barrier layer. In the present invention, it is specifically preferable to use amine catalysts. Specific amine catalysts include N,N-diethylethanolamine, N,N-dimethylethanolamine, triethanolamine, triethylamine, 3-morpholinopropylamine, N,N,N',N'-tetramethyl-1,3-diaminopropane, N,N,N',N'-tetramethyl-1,6-diaminohexane and the like.

The addition amount of these catalysts with respect to the polysilazane is preferably in the range of from 0.1 to 10% by mass, more preferably in the range of from 0.2 to 5% by mass, further preferably in the range of from 0.5 to 2% by mass with respect to the total mass of the application liquid for forming a gas barrier layer. By setting the addition amount of the catalyst to be within this range, formation of excess silanol and decrease in film density due to the rapid progress of the reaction, increase of film defects, and the like can be avoided.

As the method for applying the application liquid containing polysilazane for forming a gas barrier layer, an optional suitable method can be adopted. Specific examples include a roller coat process, a flow coat process, an inkjet process, a spray coat process, a print process, a dip coat process, a flow film formation process, a bar coat process, a gravure printing process and the like.

The thickness of the coating can be suitably preset depending on the purpose. For example, the thickness of the coating is preferably in the range of from 50 nm to 2 μm, more preferably in the range of from 70 nm to 1.5 μm, further preferably in the range of from 100 nm to 1 μm as the thickness after drying.

In the gas barrier layer, at least a part of the polysilazane is modified to acid silicon nitride in the step of irradiating the layer containing polysilazane with a vacuum ultraviolet ray (VUV).

Meanwhile, the assumed mechanism of the modification of the coating containing polysilazane to be a specific composition of $SiO_xN_y$ in the step of irradiating with a vacuum ultraviolet ray will be explained with exemplifying perhydropolysilazane.

Perhydropolysilazane can be represented by the composition of "—$(SiH_2—NH)_n$—". In the case when representing with $SiO_xN_y$, x=0 and y=1. An outer oxygen source is required so as to achieve x>0, and (i) the oxygen and water content contained in the polysilazane application liquid, (ii) the oxygen and water content that are taken into the coating from the atmosphere during the processes of the application and drying, (iii) the oxygen, water content ozone and singlet oxygen that are taken into the coating from the atmosphere in the vacuum ultraviolet ray irradiation step, (iv) the oxygen and water content that are transferred into the coating from the side of the substrate by the heat that is applied during the vacuum ultraviolet ray irradiation step, and the like, (v) in the case when the vacuum ultraviolet ray irradiation step is conducted under a non-oxidative atmosphere, the oxygen and water content that are taken from the atmosphere into the coating during the transfer from the non-oxidative atmosphere to the oxidative atmosphere, and the like serve as the oxygen source.

On the other hand, with respect to y, it is considered that the condition under which nitridation of Si proceeds is very special as compared to oxidation, and thus 1 is the upper limit in essence.

Furthermore, in view of the relationship of the bonds of Si, O and N, x and y are within the range of $2x+3y \leq 4$ in essence. In the state of y=0 in which the oxidation has completely proceeded, there are some cases in which silanol groups are contained in the coating and x is in the range of $2<x<2.5$.

The reaction mechanism from which it is presumed that acid silicon nitride, as well as silicon oxide are generated from the perhydropolysilazane in the vacuum ultraviolet ray irradiation step will be explained below.

(1) Dehydrogenation, and Formation of Si—N Bonds Associated with Dehydrogenation It is considered that the Si—H bonds and N—H bonds in the perhydropolysilazane are cut in a relatively easy manner by the excitation due to the irradiation of a vacuum ultraviolet ray and the like, and are re-bonded as Si—N under an inert atmosphere (dangling bonds of Si are formed in some cases). In other words, the perhydropolysilazane is cured as a $SiN_y$ composition without being oxidized. In this case, the cleavage of the polymer main chain is not generated. The cleavage of the Si—H bonds and N—H bonds are promoted by the presence of a catalyst, and heating. The Hs that have been cleaved are released as $H_2$ out of the film.

(2) Formation of Si—O—Si Bonds by Hydrolysis/Dehydration Condensation

The Si—N bonds in the perhydropolysilazane are hydrolyzed by water, and the polymer main chain is cleaved to form Si—OHs. Two Si—OHs are dehydration-condensed to form a Si—O—Si bond, whereby the polymer is cured. This is a reaction that also occurs in the air, and in the irradiation of a vacuum ultraviolet ray under an inert atmosphere, it is considered that the water vapor that generates as an out gas from a resin substrate by the heat of irradiation becomes a major water content source. When the water content is in excess, the Si—OHs that have not been dehydration-condensed remain, and thus a cured film having a composition represented by $SiO_{2.1}$ to $SiO_{2.3}$ and having a low gas barrier property is formed.

(3) Direct Oxidation and Formation of Si—O—Si Bonds by Singlet Oxygen

During the irradiation of a vacuum ultraviolet ray, when a suitable amount of oxygen is present under the atmosphere, singlet oxygen, which has very strong potential of oxidation, is formed. The H and N in the perhydropolysilazane are replaced with O to form Si—O—Si bonds, whereby curing is conducted. It is considered that there is also a case when the bonds are recombined by the cleavage of the polymer main chain.

(4) Oxidation Accompanying Cleavage of Si—N Bonds by Irradiation of Vacuum Ultraviolet Ray and Excitation It is considered that, since the energy of the vacuum ultraviolet ray is higher than the bonding energy of the Si—N in the perhydropolysilazane, the Si—N bonds are cleaved, and when oxygen sources such as oxygen, ozone and water are present in the surrounding area, the Si—N bonds are oxidized to form Si—O—Si bonds and Si—O—N bonds. It is considered that there is also a case when the bonds are recombined by the cleavage of the polymer main chain.

The composition of the acid silicon nitride of the layer formed by irradiating the layer containing polysilazane with a vacuum ultraviolet ray can be adjusted by controlling the oxidation state by suitably combining the oxidation mechanisms of the above-mentioned (1) to (4).

<Vacuum Ultraviolet Ray Irradiation Device Having Excimer Lamp>

As a preferable ultraviolet irradiation device that is for a modification treatment of the polysilazane, a rare gas excimer lamp that emits a vacuum ultraviolet ray within the range of from 100 to 230 nm is specifically exemplified.

Since atoms of rare gases such as Xe, Kr, Ar and Ne and the like do not form molecules by chemical bonding, they are referred to as inert gases. However, atoms that have obtained energy by discharging or the like of a rare gas can make molecules by binding with other atoms.

In the case when the rare gas is Xe (xenon), as represented by the following reaction formulas, excimer light of 172 nm is emitted when $Xe_2^*$, which is an excited excimer molecule, transits to a ground state.

$e + Xe \rightarrow Xe^*$ $Xe^* + 2Xe \rightarrow Xe_2^* + Xe$ $Xe_2^* \rightarrow Xe + Xe + h\omega(172\ nm)$ The characteristics of the excimer lamp include that the excimer lamp has a high efficiency since radiations are concentrated in one wavelength, and lights other than necessary lights are radiated little. Furthermore, since excess lights are not radiated, the temperature of an object can be kept relatively low. In addition, since a long time is not necessary for starting and restarting, instant lighting and blinking are possible.

As a light source that efficiently irradiates an excimer light, a dielectric barrier discharge lamp is exemplified.

The constitution of the dielectric barrier discharge lamp is such that discharging is caused between electrodes through a dielectric, and generally, it is sufficient that at least one of electrodes is disposed on a discharging container formed of a dielectric and the outside thereof. As the dielectric barrier discharge lamp, for example, a dielectric barrier discharge lamp including a double-cylindrical discharging container formed of a thick tube and a thin tube comprised by quartz glass, and a rare gas such as xenon enclosed therein, a first net-shaped electrode disposed on the outer part of the discharging container, and another electrode disposed on the inside of the inner tube is exemplified.

The dielectric barrier discharge lamp generates dielectric barrier discharging inside of the discharging container by applying a high frequency voltage or the like to between the electrodes, and generates excimer light during the disassociation of excimer molecules such as xenon which have been generated by the discharging.

Since the light generation efficiency is high in the excimer lamp, it is possible to light the excimer lamp by injecting a low electrical power. Furthermore, since the excimer lamp does not emit a light having a long wavelength, which causes temperature raising, but irradiates an energy at a single wavelength in the ultraviolet region, the excimer lamp has a characteristic that it can suppress the temperature raising of an object to be irradiated by the irradiated light itself.

The illuminance of the vacuum ultraviolet ray on the coating surface received by the polysilazane layer coating is preferably in the range of from 30 to 200 mW/cm², more preferably in the range of from 50 to 160 mW/cm². 30 mW/cm² or more is preferable since decrease in the modification efficiency is not concerned, and 200 mW/cm² or less is preferable since abrasion does not occur on the coating and the substrate is not damaged.

The amount of the irradiation energy of the vacuum ultraviolet ray on the polysilazane layer coating surface is preferably in the range of from 200 to 10,000 mJ/cm², more preferably in the range of from 500 to 5,000 mJ/cm². At 200 mJ/cm² or more, the modification can be conducted sufficiently, and at 10,000 mJ/cm² or less, the modification is not excessive, and cracks are not generated and the substrate is not deformed by heat.

[First Transparent Electrode]

The first transparent electrode and the second transparent electrode in the present invention are comprised by material (s) selected from an identical group of materials. That "selected from an identical group of materials" herein refers to that the material(s) selected from the following group of materials is/are used in the electrodes. Specifically, from the viewpoint of making the designing of two-side light emission easy, it is preferable that the first transparent electrode and the second transparent electrode are respectively comprised by an identical material. Furthermore, if the electrodes are comprised by an identical material, it is also advantageous in production costs.

The group of materials that can be used in the first transparent electrode include aluminum, silver, magnesium, lithium, magnesium/copper mixture, magnesium/silver mixture, magnesium/aluminum mixture, magnesium/indium mixture, indium, lithium/aluminum mixture, rare earth metals, oxide semiconductors such as ITO, ZnO, $TiO_2$ and $SnO_2$, and the like.

The constitution of the first transparent electrode is, for example, as shown in FIG. 1, preferably such that the first transparent electrode 101 has a two layer structure in which a primer layer 101a and an electrode layer 101b formed on the upper part thereof are stacked in this order from the side of the transparent substrate 110. Among these, it is preferable that the electrode layer 101b is, for example, a layer comprised by using silver or an alloy containing silver as a major component, and that the primer layer 101a is, for example, a layer containing an organic compound having at least one kind of atom selected from a nitrogen atom and a sulfur atom.

The "transparent" in the first transparent electrode 101 refers to that the light transmittance at a wavelength of 550 nm is 50% or more. Furthermore, the main component in the electrode layer 101b is that the content in the electrode layer 101b is 98% mass or more.

(1) Primer Layer

The primer layer 101a is a layer that is disposed on the side of the transparent substrate 110 of the electrode layer 110b. The material that constitutes the primer layer 101a is not specifically limited, and may be any material that can suppress the aggregation of silver in the formation of the electrode layer 101b formed of silver or an alloy containing silver as a main component, and examples include organic compounds each having at least one kind of atom selected from a nitrogen atom and a sulfur atom, and the like.

The above-mentioned organic compounds may be one kind, or may be used by mixing two or more kinds. Furthermore, it is also allowed to mix a compound free from a nitrogen atom and a sulfur atom to the extent that the effect of the primer layer is not inhibited.

In the case when the primer layer 101a is formed of a low-refractive index material (having a refractive index of less than 1.7), the upper limit of the layer thickness is preferably less than 50 nm, more preferably less than 30 nm, further preferably less than 10 nm, and specifically preferably less than 5 nm. By setting the layer thickness to be less than 50 nm, optical loss can be suppressed to the minimum. On the other hand, the lower limit of the layer thickness is preferably 0.05 nm or more, more preferably 0.1 nm or more, specifically preferably 0.3 nm or more. By setting the layer thickness to be 0.05 nm or more, the film formation of the primer layer 101a can be even, and the effect thereof (suppression of the aggregation of silver) can be even.

In the case when the primer layer 101a is formed of a high-refractive index material (having a refractive index of 1.7 or more), the upper limit of the layer thickness thereof is not specifically limited, and the lower limit of the layer thickness is similar to that in the case when the primer layer 101a is formed of the above-mentioned low-refractive index material.

However, as a mere function of the primer layer 101a, it is sufficient as long as the primer layer is formed at a layer thickness that is required for forming a homogeneous film formation.

As the method for the film formation of the primer layer 101a, methods using wet processes such as an application process, an inkjet process, a coating process and a dipping process, and methods using dry processes such as deposition processes (resistant heating, an EB process and the like), a sputtering process and a CVD process, and the like are exemplified. Among these, the deposition process is preferably applied.

The organic compounds each having at least one kind of atom selected from a nitrogen atom and a sulfur atom will be explained below.

(1-1) Organic Compound Having Nitrogen Atom

The organic compound having nitrogen atom(s) is preferably a compound having a melting point of 80° C. or more and a molecular weight Mw within the range from 150 to 1,200, and is preferably a compound having a high interaction with silver or an alloy of silver, and examples include nitrogen-containing heterocyclic compounds, phenyl group-substituted amine compounds and the like.

Furthermore, the organic compound having nitrogen atom(s) is a compound that has been selected so as to have an effective noncovalent electron pair content ratio [n/M] (the ratio of the number n of the effective noncovalent electron pairs to the molecular weight M of the organic compound having nitrogen atom(s)) of $2.0 \times 10^{-3}$ or more, more preferably $3.9 \times 10^{-3}$ or more.

The effective noncovalent electron pairs herein refers to the noncovalent electron pairs that are not involved in aromaticity and are not coordinated to a metal among the noncovalent electron pairs possessed by the nitrogen atom(s) constituting the compound.

The aromaticity herein refers to an unsaturated cyclic structure in which atoms having π electrons are disposed in a cyclic form, and is aromaticity in accordance with so-called "Huckel's Rule", and the condition thereof is that the number of the electrons included in the π electron system on the ring is "4n+2" (wherein n is an integer of 0 or more).

The effective noncovalent electron pairs as mentioned above are selected depending on whether or not the noncovalent electron pairs possessed by the nitrogen atom are involved in aromaticity, irrespective of whether or not the nitrogen atom having the noncovalent electron pairs itself is the hetero atom constituting the aromatic ring. For example, even in the case when a certain nitrogen atom is a hetero atom that constitutes an aromatic ring, if the nitrogen atom has a noncovalent electron pair that is not involved in aromaticity, the noncovalent electron pair is counted as one of effective noncovalent electron pairs.

In response to this, even in the case when a certain nitrogen atom is not a hetero atom that constitutes an aromatic ring, if all of the noncovalent electron pairs of the nitrogen atom are involved in aromaticity, then the noncovalent electron pairs of the nitrogen atom are not counted as effective noncovalent electron pairs.

In each compound, the number n of the effective noncovalent electron pairs is identical with the number of the nitrogen atoms having effective noncovalent electron pairs.

In the case when the primer layer is comprised by using an organic compound having plural nitrogen atoms, the effective noncovalent electron pair content ratio [n/M] is preferably a value in the above-mentioned predetermined range, which is obtained by calculating the molecular weight M and the number n of the effective noncovalent electron pairs of the mixed compounds based on the mixing ratio of the respective compounds, and defining the ratio of the number n of the effective noncovalent electron pairs to the molecular weight M as an effective noncovalent electron pair content ratio [n/M].

As low molecular weight organic compounds having nitrogen atom(s), which constitute the primer layer, Exemplified Compound Nos. 1 to 45 each having the above-mentioned effective noncovalent electron pair content ratio [n/M] of $2.0 \times 10^{-3}$ or more will be indicated, but the compounds are not specifically limited to these. In addition, in the copper phthalocyanine of Exemplified Compound No. 31, among the noncovalent electron pairs possessed by the nitrogen atoms, the noncovalent electron pairs of the nitrogen atoms that are not coordinated to the copper are counted as effective noncovalent electron pairs.

[Chemical Formula 1]

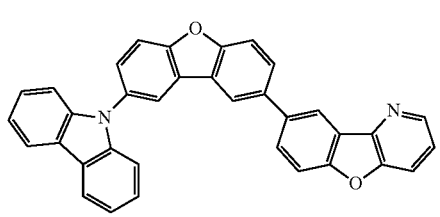

No. 1

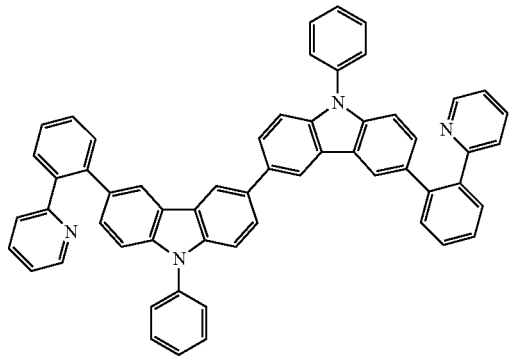

No. 2

-continued
No. 3
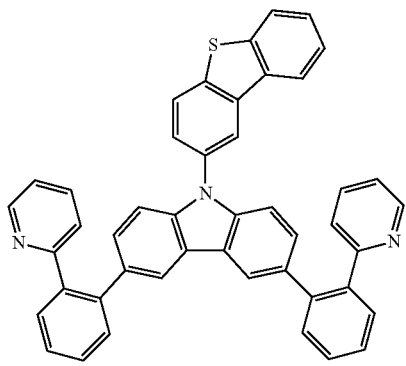
No. 4
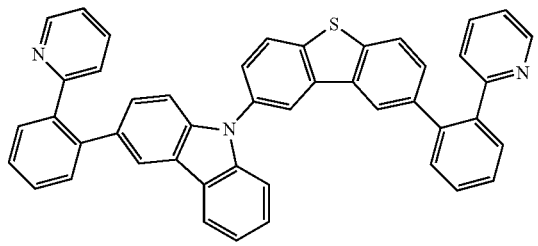
No. 5
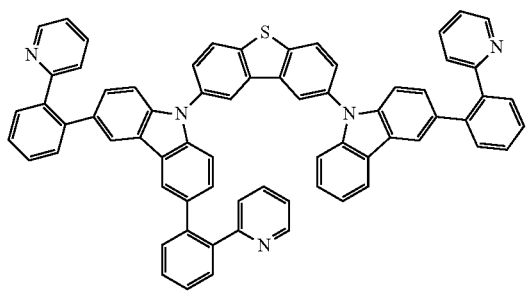
No. 6
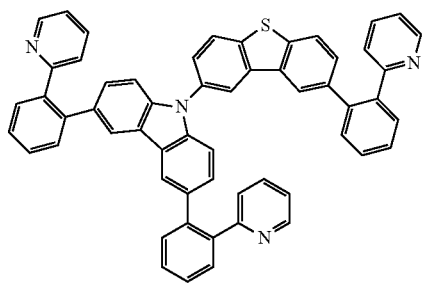
No. 7
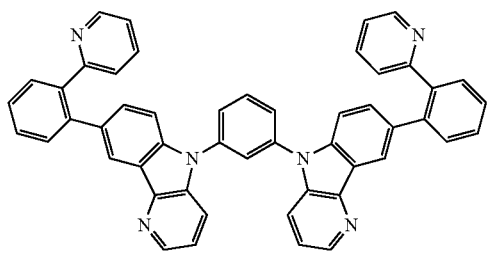
[Chemical Formula 2]
No. 8
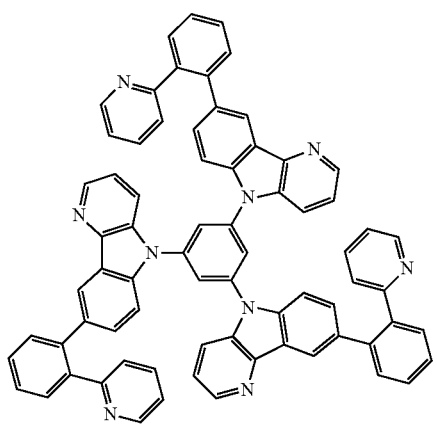

-continued
No. 9
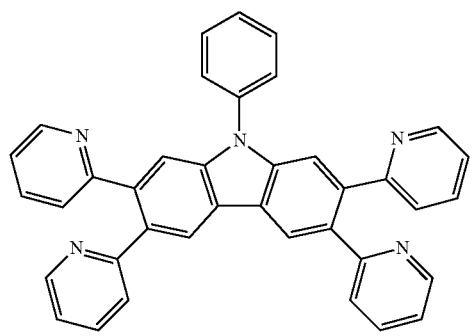
No. 10
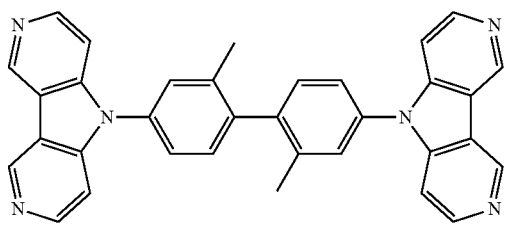
No. 11
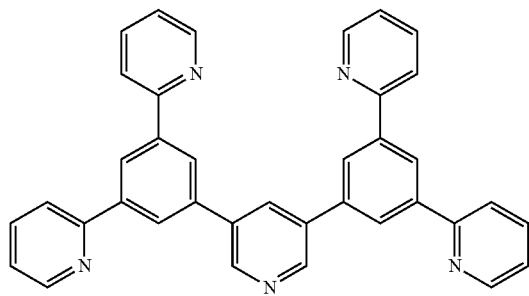
No. 12
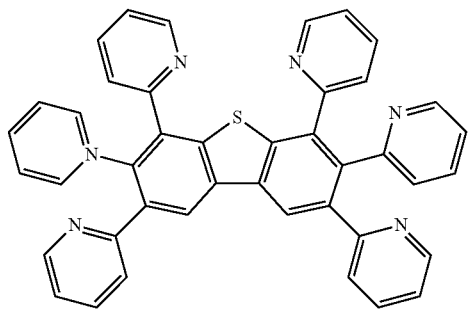
No. 13
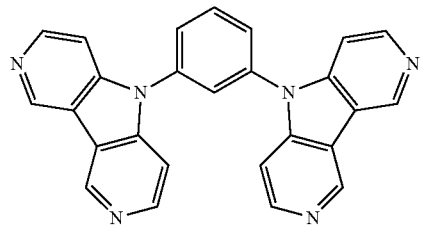
No. 14
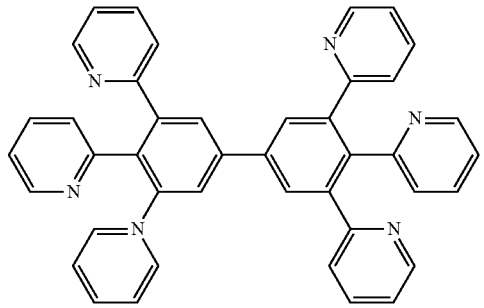
No. 15
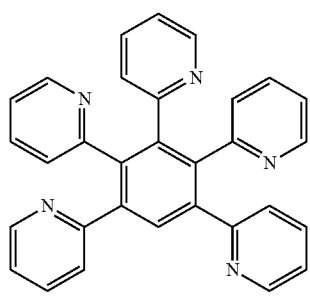
No. 16
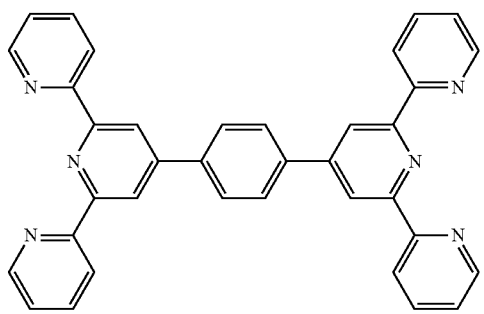

[Chemical Formula 3]
No. 17
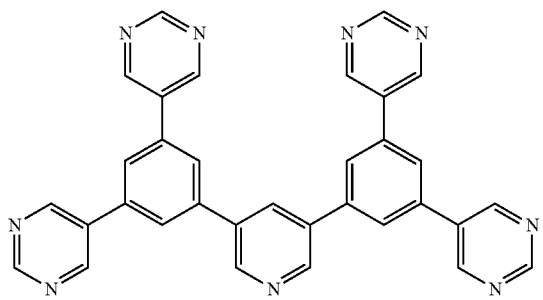
No. 18
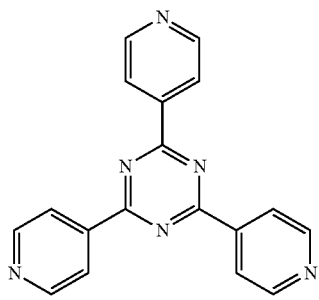
No. 19
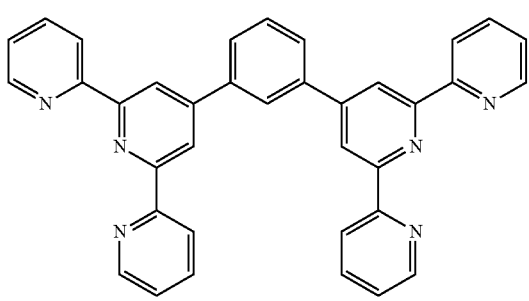
No. 20
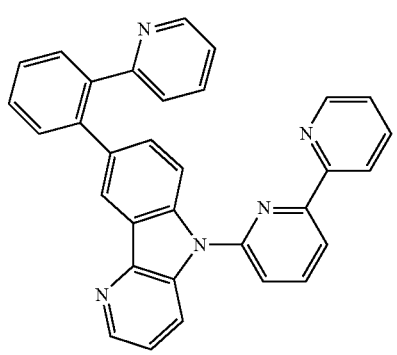
No. 21
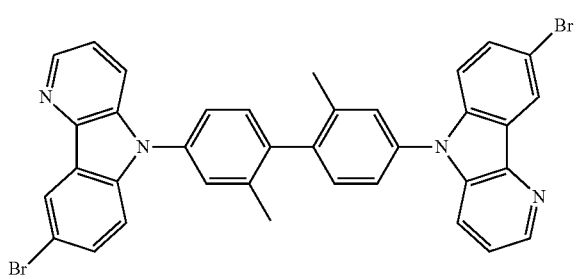
No. 22
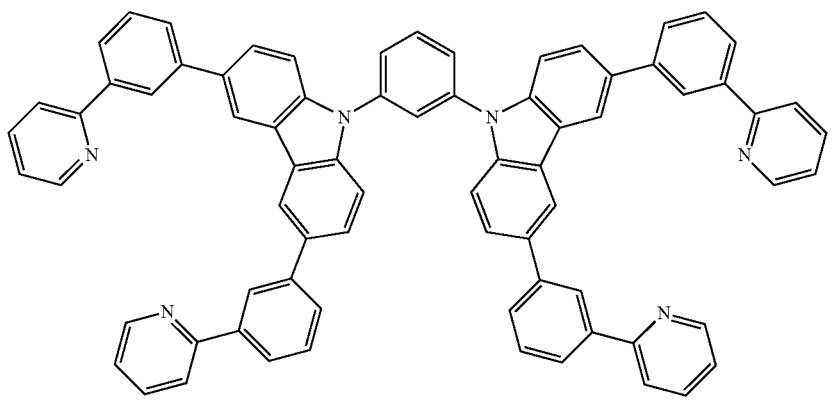

No. 23
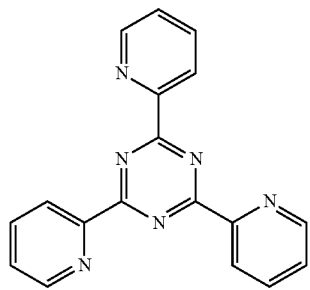
[Chemical Formula 4]
No. 24
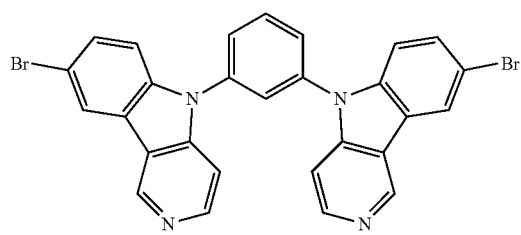
No. 25
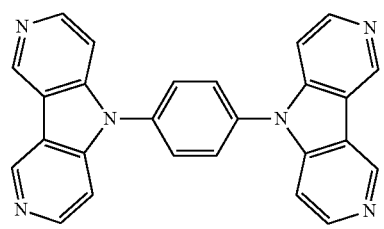
No. 26
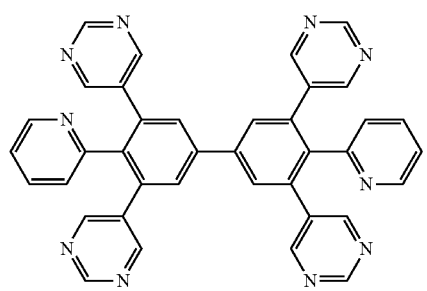
No. 27
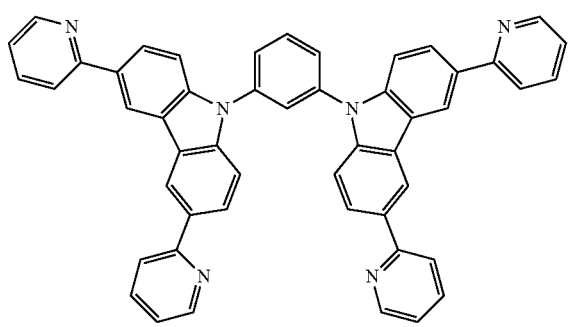
No. 28
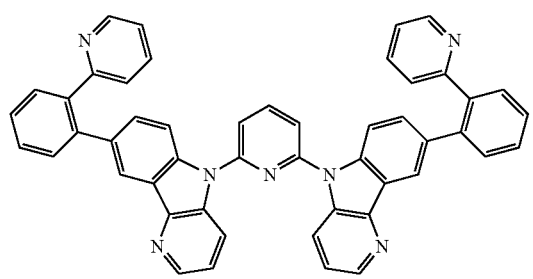
No. 29
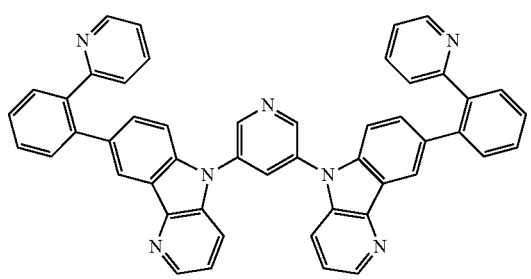
No. 30
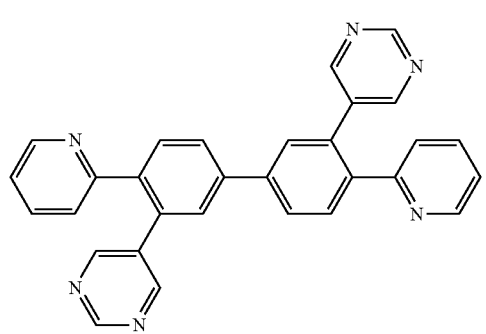
No. 31
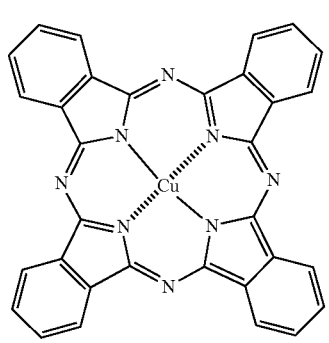

No. 32
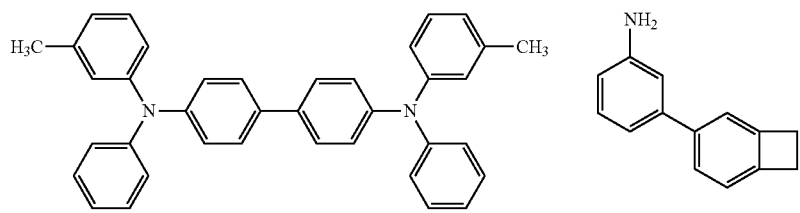
No. 33
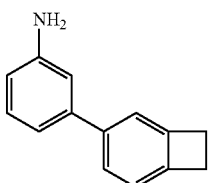
[Chemical Formula 5]
No. 34
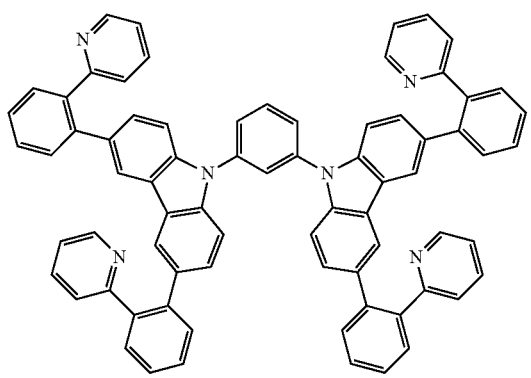
No. 35
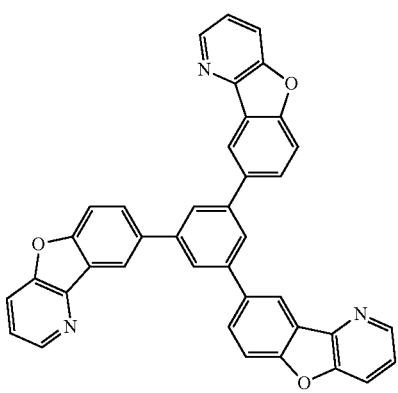
No. 36
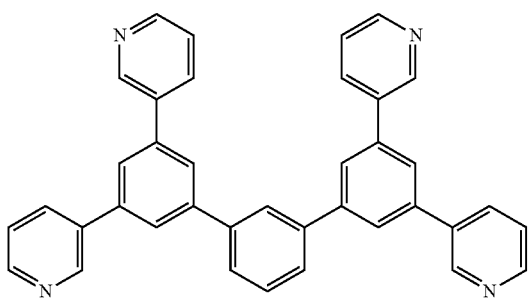
No. 37
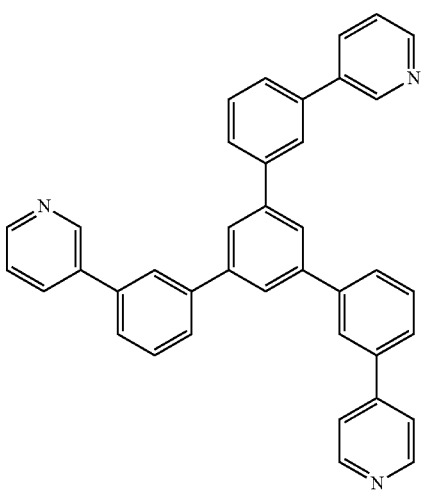
No. 38
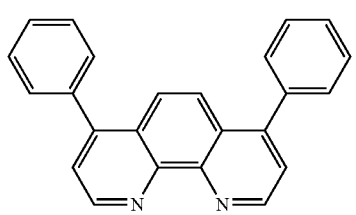

[Chemical Formula 6]
No. 39
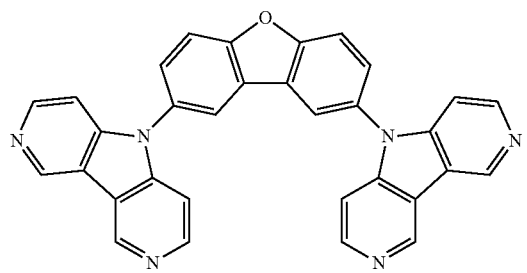
No. 40
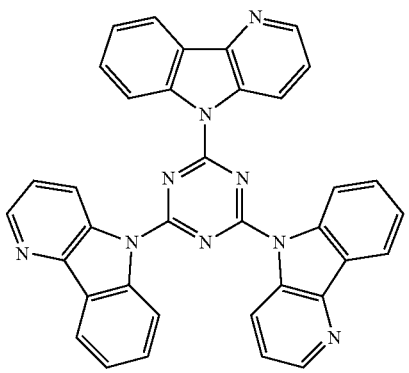
No. 41
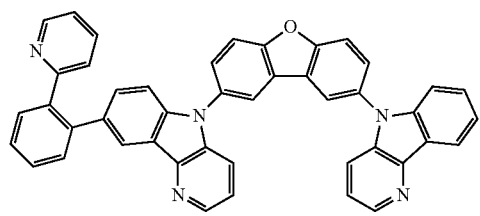
No. 42
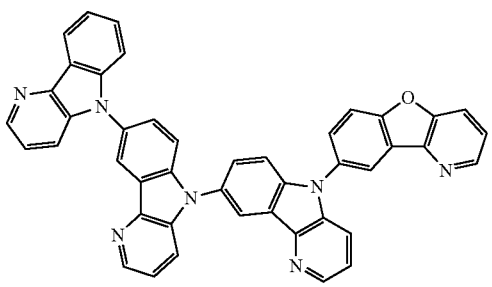
No. 43
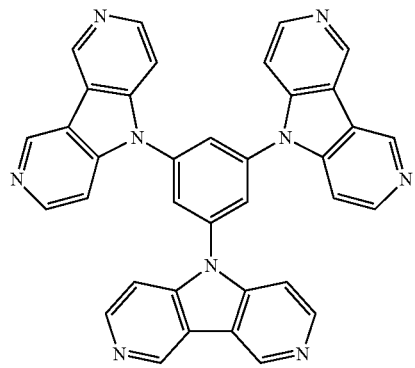
No. 44
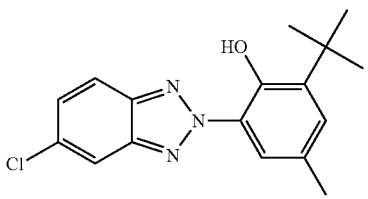
No. 45
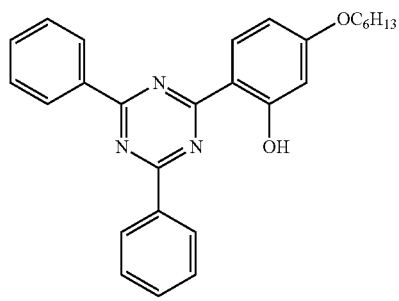

For the above-mentioned Exemplified Compounds Nos. 1 to 45, the number n of the effective noncovalent electron pairs, the molecular weight M and the effective noncovalent electron pair content ratio [n/M] are shown in Table 1.

TABLE 1

| Number of Exemplified Compound | Number of effective noncovalent electron pairs (n) | Molecular weight (M) | Effective noncovalent electron pair content ratio [n/M] |
|---|---|---|---|
| No. 1 | 1 | 500.55 | 0.0020 |
| No. 2 | 2 | 790.95 | 0.0025 |
| No. 3 | 2 | 655.81 | 0.0030 |
| No. 4 | 2 | 655.81 | 0.0030 |
| No. 5 | 3 | 974.18 | 0.0031 |
| No. 6 | 3 | 808.99 | 0.0037 |
| No. 7 | 4 | 716.83 | 0.0056 |
| No. 8 | 6 | 1036.19 | 0.0058 |
| No. 9 | 4 | 551.64 | 0.0073 |
| No. 10 | 4 | 516.60 | 0.0077 |
| No. 11 | 5 | 539.63 | 0.0093 |
| No. 12 | 6 | 646.76 | 0.0093 |
| No. 13 | 4 | 412.45 | 0.0097 |
| No. 14 | 6 | 616.71 | 0.0097 |
| No. 15 | 5 | 463.53 | 0.0108 |
| No. 16 | 6 | 540.62 | 0.0111 |
| No. 17 | 9 | 543.58 | 0.0166 |
| No. 18 | 6 | 312.33 | 0.0192 |
| No. 19 | 6 | 540.62 | 0.0111 |
| No. 20 | 4 | 475.54 | 0.0084 |
| No. 21 | 2 | 672.41 | 0.0030 |
| No. 22 | 4 | 1021.21 | 0.0039 |
| No. 23 | 6 | 312.33 | 0.0192 |
| No. 24 | 2 | 568.26 | 0.0035 |
| No. 25 | 4 | 412.45 | 0.0097 |
| No. 26 | 10 | 620.66 | 0.0161 |
| No. 27 | 4 | 716.83 | 0.0056 |
| No. 28 | 5 | 717.82 | 0.0070 |
| No. 29 | 5 | 717.82 | 0.0070 |
| No. 30 | 6 | 464.52 | 0.0129 |
| No. 31 | 4 | 576.10 | 0.0069 |
| No. 32 | 2 | 516.67 | 0.0039 |
| No. 33 | 1 | 195.26 | 0.0051 |
| No. 34 | 4 | 1021.21 | 0.0039 |
| No. 35 | 3 | 579.60 | 0.0052 |
| No. 36 | 4 | 538.64 | 0.0074 |
| No. 37 | 3 | 537.65 | 0.0056 |
| No. 38 | 2 | 332.40 | 0.0060 |
| No. 39 | 4 | 502.15 | 0.0080 |
| No. 40 | 6 | 579.19 | 0.0104 |
| No. 41 | 3 | 653.22 | 0.0046 |
| No. 42 | 4 | 667.21 | 0.0060 |
| No. 43 | 6 | 579.19 | 0.0104 |
| No. 44 | 2 | 318.63 | 0.0063 |
| No. 45 | 3 | 425.53 | 0.0070 |

(1-2) Polymer Having Nitrogen Atoms

In the present invention, a polymer can also be used as the organic compound having nitrogen atom(s). It is preferable that the polymer having nitrogen atoms has a weight average molecular weight within the range of from 1,000 to 1,000,000.

As the polymer having nitrogen atoms, a polymer having a partial structure represented by the following general formula (P1), or a polymer having a partial structure represented by the following general formula (P2) is preferable.

[Chemical Formula 7]

General Formula (P1)

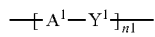

In the general formula (P1), $A^1$ represents a bivalent nitrogen atom-containing group. $Y^1$ represents a bivalent organic group or a bond. n1 represents a repeating number that gives a weight average molecular weight in the range from 1,000 to 1,000,000.

[Chemical Formula 8]

General Formula (P2)

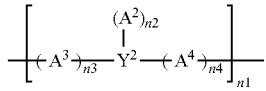

In the general formula (P2), $A^2$ represents a monovalent nitrogen atom-containing group. n2 represents an integer of 1 or more. n2 is preferably an integer of 1 to 3 in view of interactivity with silver, and is more preferably 1 or 2 in view of easiness of synthesis. When n2 is 2 or more, the plural $A^2$ may be the same or different. $A^3$ and $A^4$ each represents a bivalent nitrogen atom-containing group. $A^3$ and $A^4$ may be the same or different. n3 and n4 each independently represents 0 or 1. $Y^2$ represents an organic group having a valency of (n2+2). n1 represents a repeating number that gives a weight average molecular weight within the range of from 1,000 to 1,000,000.

The polymer having a partial structure represented by the above-mentioned general formula (P1) or (P2) may be a homopolymer (homopolymer) comprised by only a single constitutional unit derived from the above-mentioned general formula (P1) or (P2), or may be a copolymer (copolymer) comprised by only two or more kinds of constitutional units derived from the above-mentioned general formula (P1) and/or (P2).

Alternatively, a copolymer can be formed by further having other structural unit having no nitrogen atom-containing group in addition to the structural unit represented by the above-mentioned general formula (P1) or (P2).

In the case when the polymer having nitrogen atoms has other structural unit having no nitrogen atom-containing group, the content of the monomer derived from the other structural unit is not specifically limited as long as it is of the degree that the effect of the polymer having nitrogen atoms in the present invention is not deteriorated, and is preferably in the range of from 10 to 75 mol %, more preferably in the range of from 20 to 50 mol % in the monomers derived from all structural units.

The terminal of the polymer having a partial structure represented by the general formula (P1) or (P2) is not specifically limited and suitably limited by the kind of the raw materials (monomers) as used, and is generally a hydrogen atom.

In the general formula (P2), the monovalent nitrogen atom-containing group represented by $A^2$ is not specifically limited as long as it is an organic group having a nitrogen atom. Examples of such nitrogen atom-containing group include an amino group, a dithiocarbamate group, a thioamide group, a cyano group (—CN), an isonitrile group (—N$^+$≡C$^-$), an isocyanate group (—N═C═O), a thioisocyanate group (—N═C═S), or groups containing a substituted or unsubstituted nitrogen-containing aromatic ring.

Specific examples of the monomer that constitutes the polymer having nitrogen atoms in the present invention (PN 1 to 41) will be indicated below, but the examples are not limited to these. The polymers having nitrogen atoms are comprised by the monomers shown below at a repeating number that provides a weight average molecular weight in the range of from 1,000 to 1,000,000.

[Chemical Formula 9]
PN1
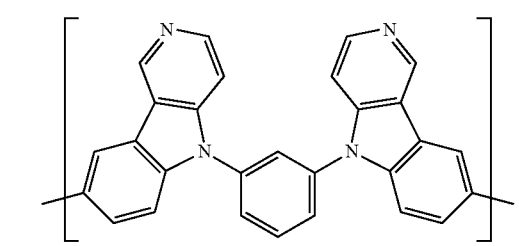
PN2
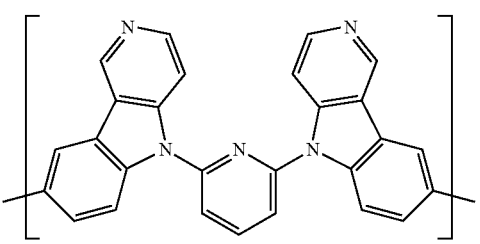
PN3
PN4
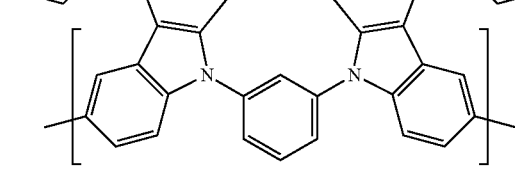
PN5
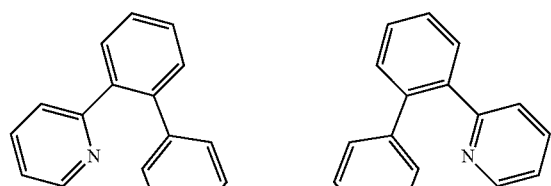
PN6
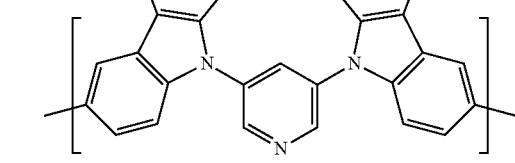
PN7
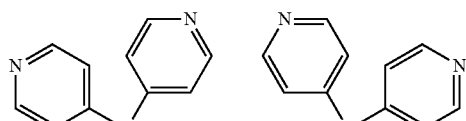
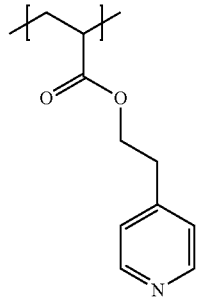
PN8
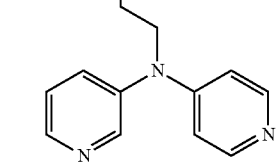
PN9
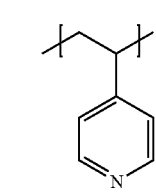
PN10
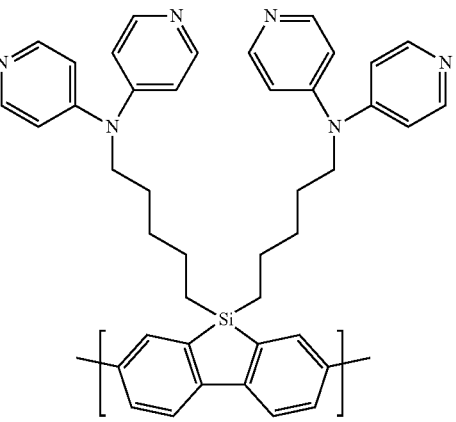

[Chemical Formula 10]
PN11
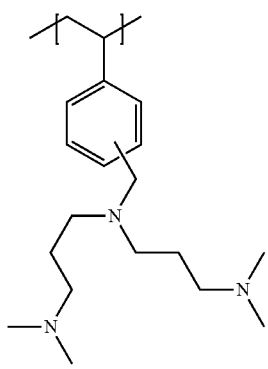
PN12
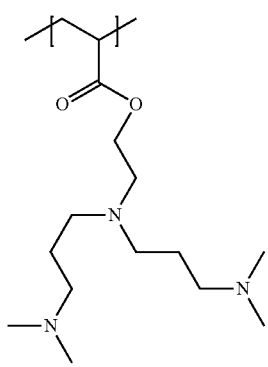
PN13
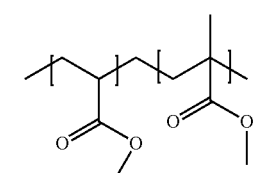
PN14
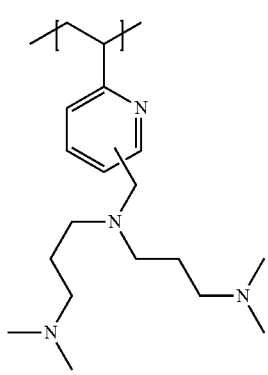
PN15
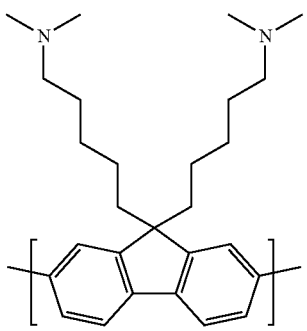
PN16
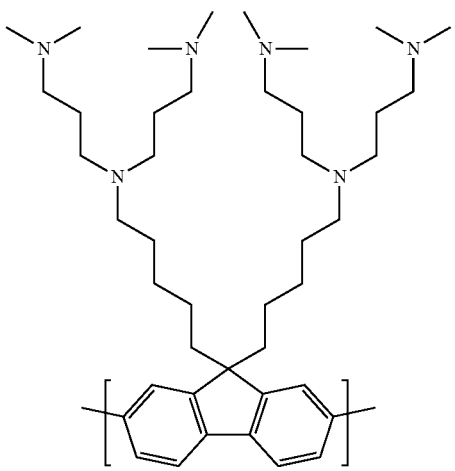
PN17
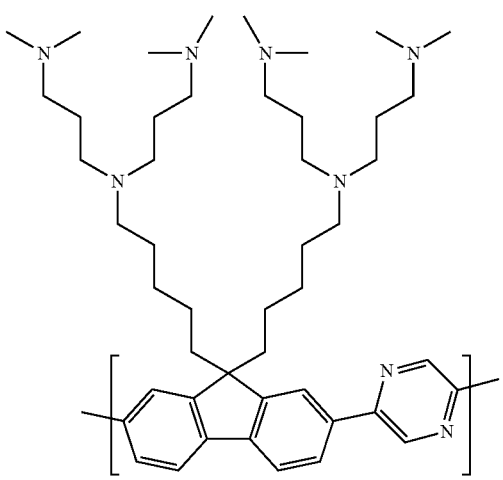

PN18
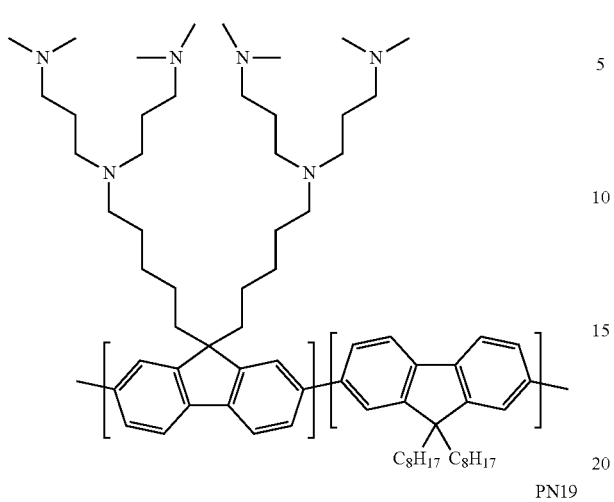
PN19
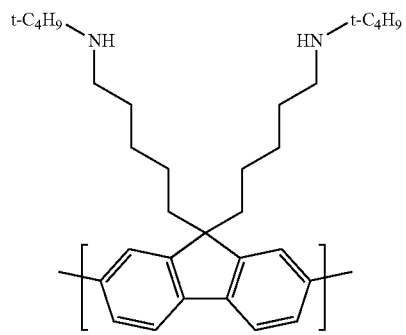
PN20
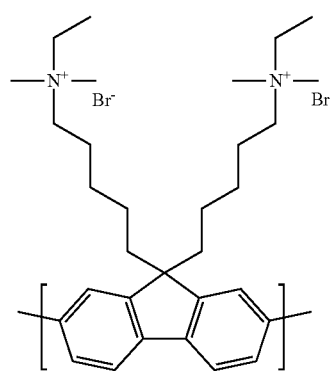
[Chemical Formula 11]
PN21
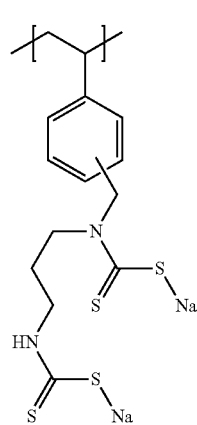
NP22
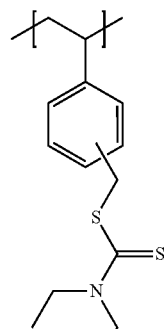
PN23
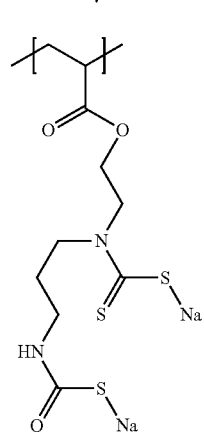
PN24
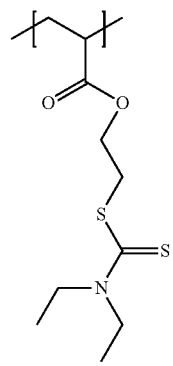
PN25

-continued
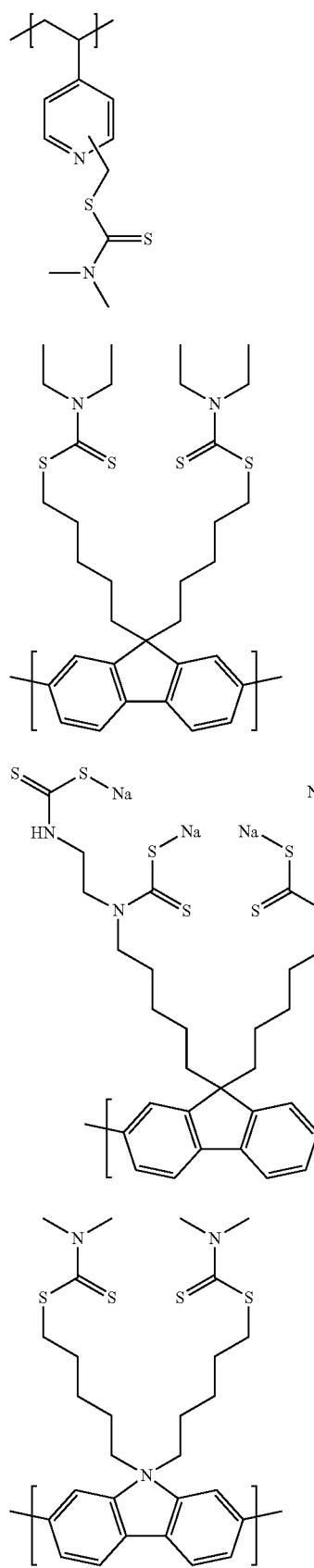
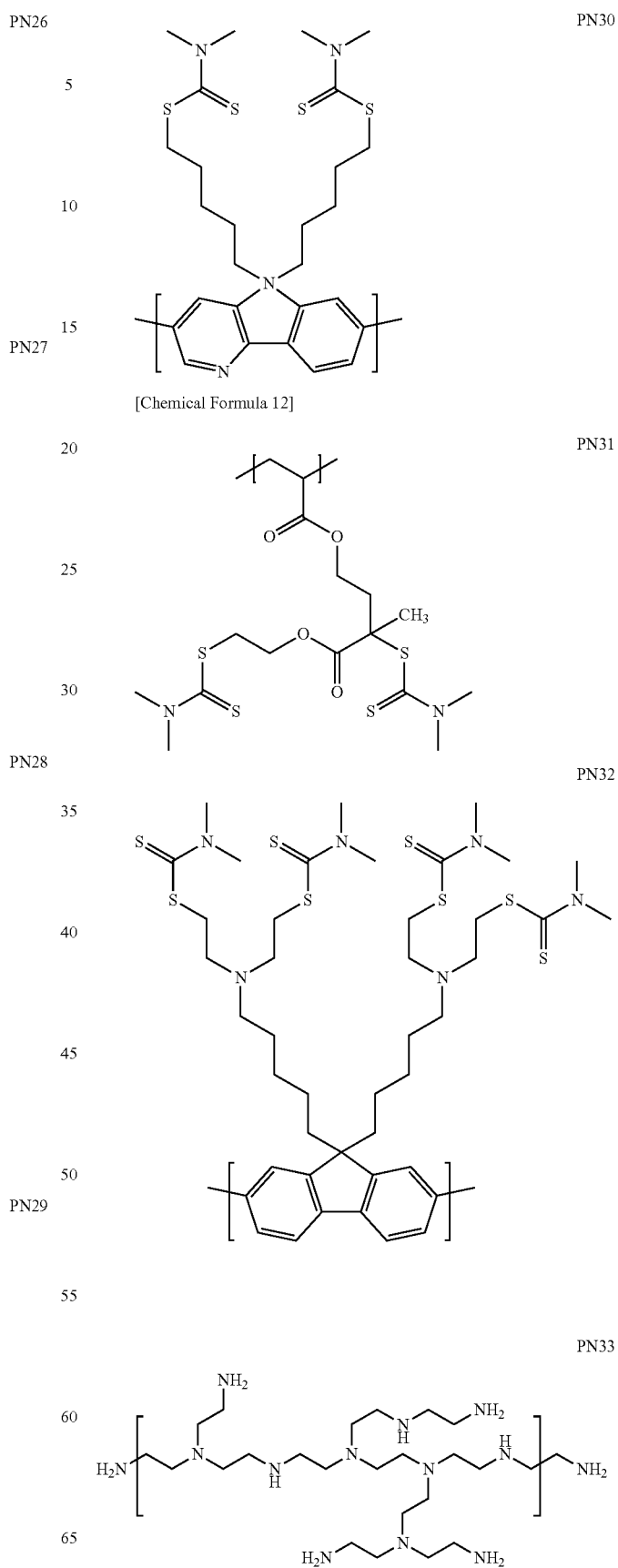
[Chemical Formula 12]

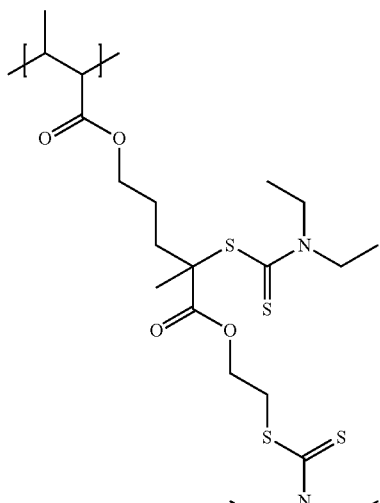

PN34

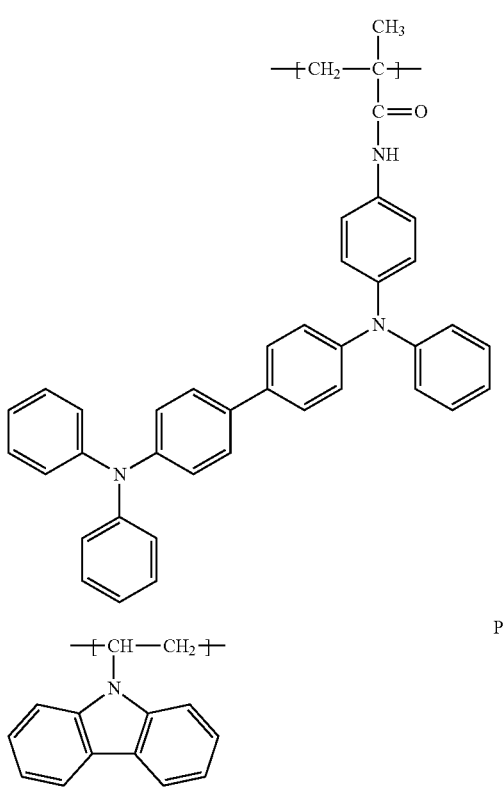

PN35

[Chemical Formula 13]

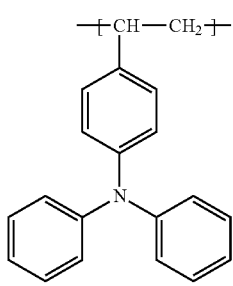

PN36

PN37

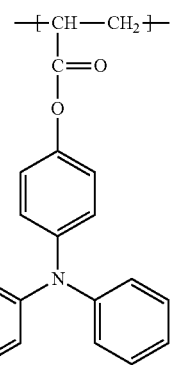

PN38

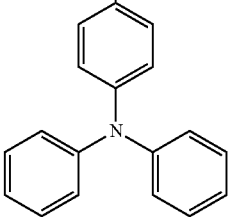

PN39

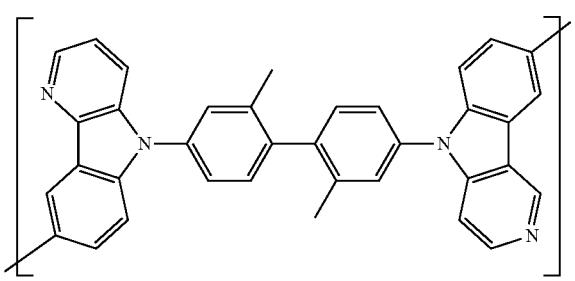

PN40

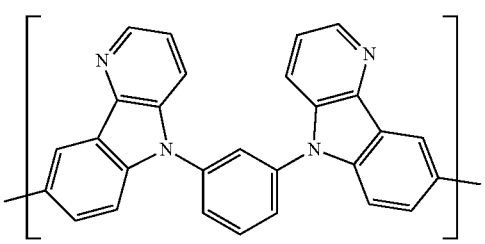

PN41

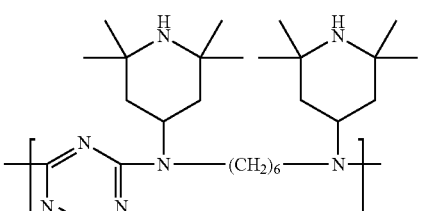

The low molecular weight organic compound and polymer having nitrogen atoms in the present invention can be synthesized by a known or well-known method.

(1-3) Organic Compound Having Sulfur Atom(s)

The organic compound having sulfur atom(s) in the present invention has a sulfide bond, a disulfide bond, a mercapto group, a sulfone group, a thiocarbonyl bond and the like in the molecule. Among these, it is preferable to have a sulfide bond or a mercapto group.

As the organic compound having sulfur atom(s), compounds represented by the following general formulas (1) to (4) are preferable.

[Chemical Formula 14]

$$R_1\text{—}S\text{—}R_2 \qquad \text{General Formula (1)}$$

In the general formula (1), $R_1$ and $R_2$ each independently represents a substituent.

[Chemical Formula 15]

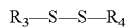
$$R_3\text{—}S\text{—}S\text{—}R_4 \qquad \text{General Formula (2)}$$

In the general formula (2), $R_3$ and $R_4$ each independently represents a substituent.

[Chemical Formula 16]

$$R_5\text{—}S\text{—}H \qquad \text{General Formula (3)}$$

In the general formula (3), $R_5$ represents a substituent.

[Chemical Formula 17]

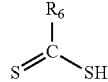

General Formula (4)

In the general formula (4), $R_6$ represents a substituent.

In the general formula (1), examples of the substituents represented by $R_1$ and $R_2$ include alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group, a pentadecyl group and the like), cycloalkyl groups (for example, a cyclopentyl group, a cyclohexyl group and the like), alkenyl groups (for example, a vinyl group, an allyl group and the like), alkynyl groups (for example, an ethynyl group, a propargyl group and the like), aromatic hydrocarbon groups (also referred to as aromatic carbon ring groups, aryl groups or the like, and examples include a phenyl group, a p-chlorophenyl group, a mesityl group, a tolyl group, a xylyl group, a naphthyl group, an anthlyl group, an azulenyl group, an acenaphthenyl group, a fluorenyl group, a phenanthryl group, an indenyl group, a pyrenyl group, a biphenylyl group and the like), aromatic heterocyclic groups (for example, a furyl group, a thienyl group, a pyridyl group, a pyridazinyl group, a pyrimidinyl group, a pyrazinyl group, a triazynyl group, an imidazolyl group, a pyrazolyl group, a thiazolyl group, a quinazolynyl group, a carbazolyl group, a carbolinyl group, a diazacarbazolyl group (this shows a group in which any one of the carbon atoms that constitute the carboline ring in a carbolinyl group has been replaced with a nitrogen atom), a phthalazinyl group and the like), heterocyclic groups (for example, a pyrrolidyl group, an imidazolyl group, a morpholyl group, an oxazolidyl group and the like), alkoxy groups (for example, a methoxy group, an ethoxy group, a propyloxy group, a pentyloxy group, a hexyloxy group, an octyloxy group, a dodecyloxy group and the like), cycloalkoxy groups (for example, a cyclopentyloxy group, a cyclohexyloxy group and the like), aryloxy groups (for example, a phenoxy group, a naphthyloxy group and the like), alkylthio groups (for example, a methylthio group, an ethylthio group, a propylthio group, a pentylthio group, a hexylthio group, an octylthio group, a dodecylthio group and the like), cycloalkylthio groups (for example, a cyclopentylthio group, a cyclohexylthio group and the like), arylthio groups (for example, a phenylthio group, a naphthylthio group and the like), alkoxycarbonyl groups (for example, a methyloxycarbonyl group, an ethyloxycarbonyl group, a butyloxycarbonyl group, an octyloxycarbonyl group, a dodecyloxycarbonyl group and the like), aryloxycarbonyl groups (for example, a phenyloxycarbonyl group, a naphthyloxycarbonyl group and the like), sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group and the like), acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group and the like), acyloxy groups (for example, an acetyloxy group, an ethylcarbonyloxy group, a butylcarbonyloxy group, an octylcarbonyloxy group, a dodecylcarbonyloxy group, a phenylcarbonyloxy group and the like), amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group and the like), carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group and the like), ureido groups (for example, a methylureido group, an ethylureido group, a pentylureido group, a cyclohexylureido group, an octylureido group, a dodecylureido group, a phenylureido group, a naphthylureido group, a 2-pyridylaminoureido group and the like), sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group and the like), alkylsulfonyl groups (for example, a methylsulfonyl group, an ethylsulfonyl group, a butylsulfonyl group, a cyclohexylsulfonyl group, a 2-ethylhexylsulfonyl group, a dodecylsulfonyl group and the like), arylsulfonyl groups or heteroarylsulfonyl groups (for example, a phenylsulfonyl group, a naphthylsulfonyl group, a 2-pyridylsulfonyl group and the like), amino groups (for example, an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, a piperidyl group (also referred to as a piperidinyl group), a 2,2,6,6-tetramethylpiperidinyl group and the like), halogen atoms (for example, a fluorine atom, a chlorine atom, a bromine atom and the like), fluorohydrocarbon groups (for example, a fluoromethyl group, a trifluoromethyl group, a pentafluoroethyl group, a pentafluorophenyl group and the like), a cyano group, a nitro group, a hydroxy group, a mercapto group, silyl groups (for example, a trimethylsilyl group, a triisopropylsilyl group, a triphenylsilyl group, a phenyldiethylsilyl group and the like), phosphate ester groups (for example, a dihexylphosphoryl group and the like), phosphite ester groups (for example, a diphenylphosphinyl group and the like), a phosphono group, and the like.

These substituent may further be optionally substituted by these substituents, or may connect to each other to form a ring.

In the general formula (2), examples of the substituents represented by $R_3$ and $R_4$ include substituents that are similar to the substituents represented by $R_1$ and $R_2$ in the general formula (1).

In the general formula (3), examples of the substituent represented by $R_5$ include substituents that are similar to the substituents represented by $R_1$ and $R_2$ in the general formula (1).

In the general formula (4), examples of the substituent represented by $R_6$ include substituents that are similar to the substituents represented by $R_1$ and $R_2$ in the general formula (1).

Exemplified Compounds (1-1) to (4-1) of the organic compound having sulfur atom(s) for constituting the primer layer will be indicated below, but the compounds are not limited to these.

[Chemical Formula 18]

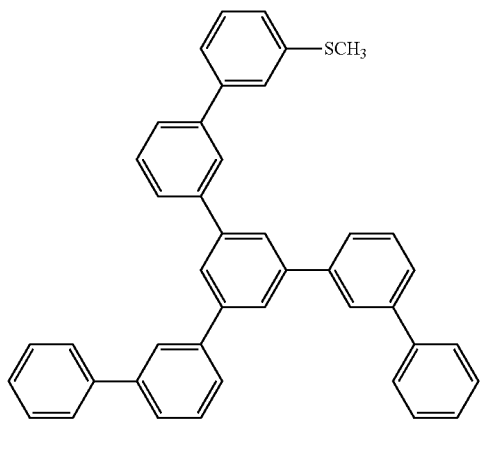
1-1

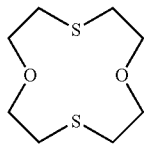
1-2

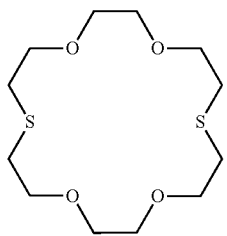
1-3

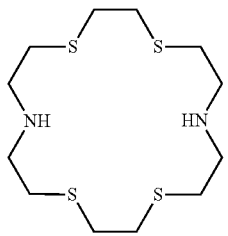
1-4

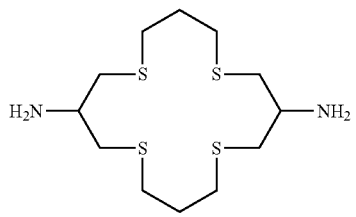
1-5

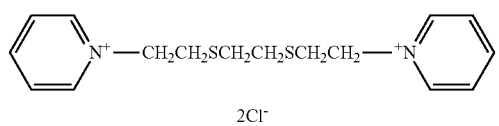
1-6

1-7

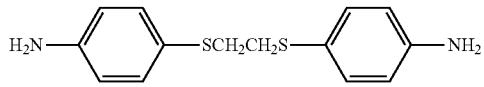
1-8

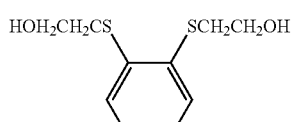
1-9

[Chemical Formula 19]

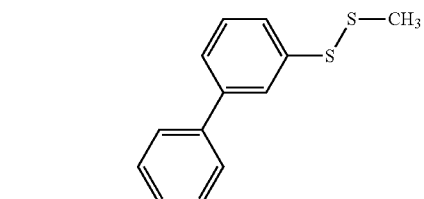
2-1

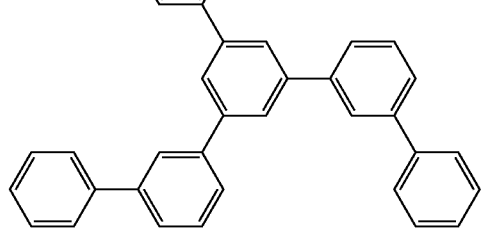
2-2

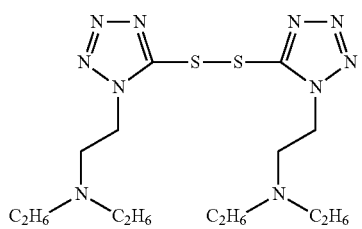
2-3

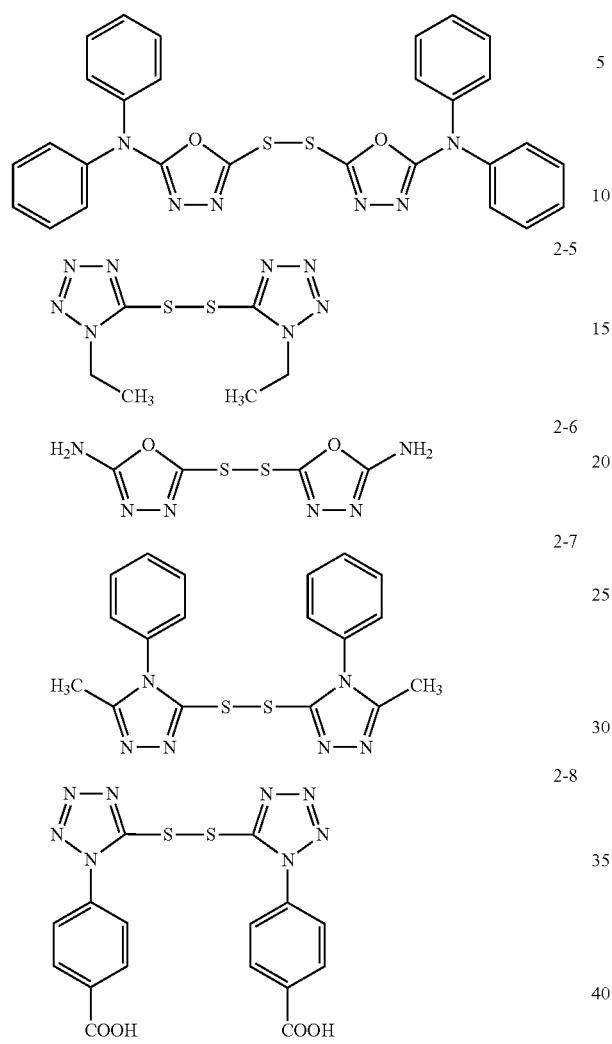
2-4
2-5
2-6
2-7
2-8
2-9
2-10
2-11
[Chemical Formula 20]
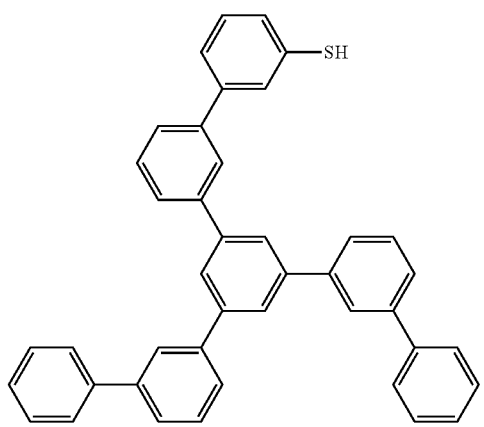
3-1
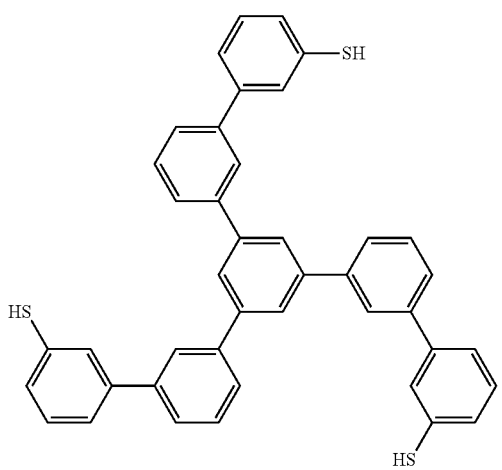
3-2
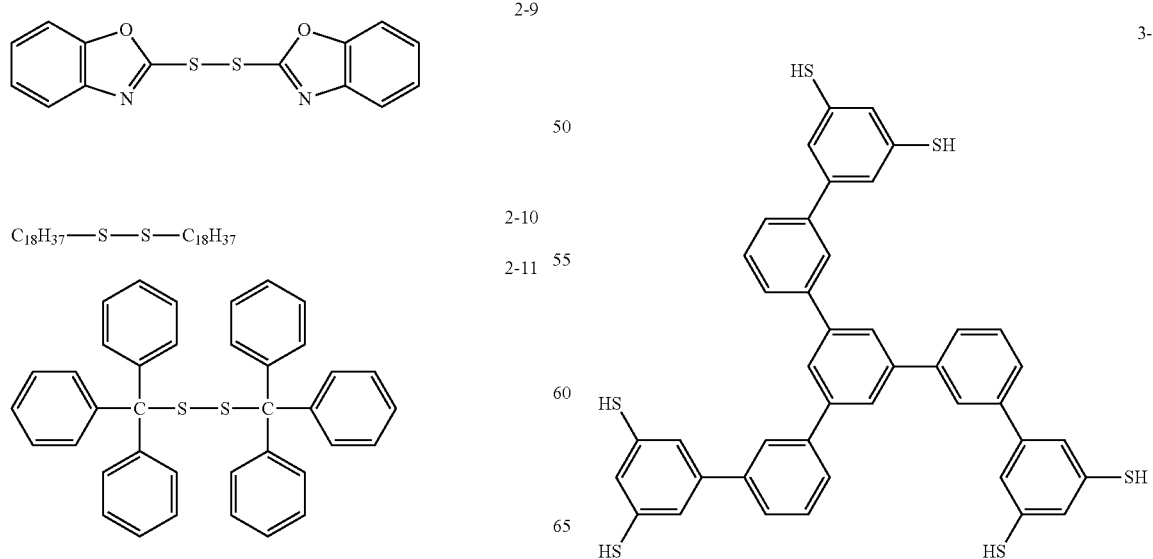
3-3

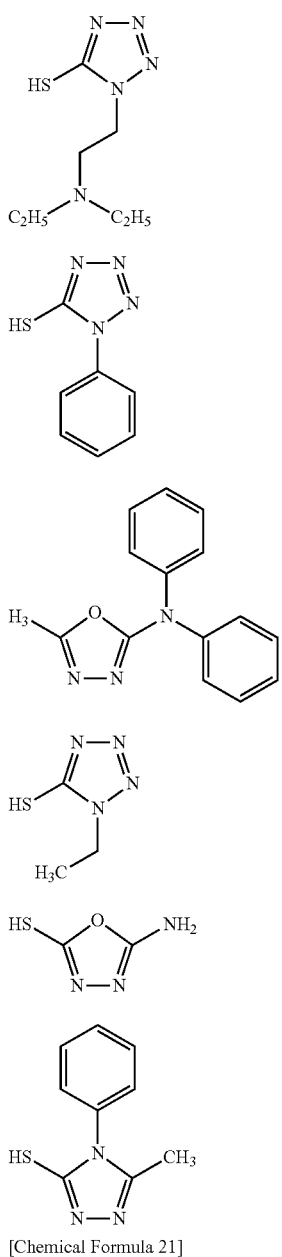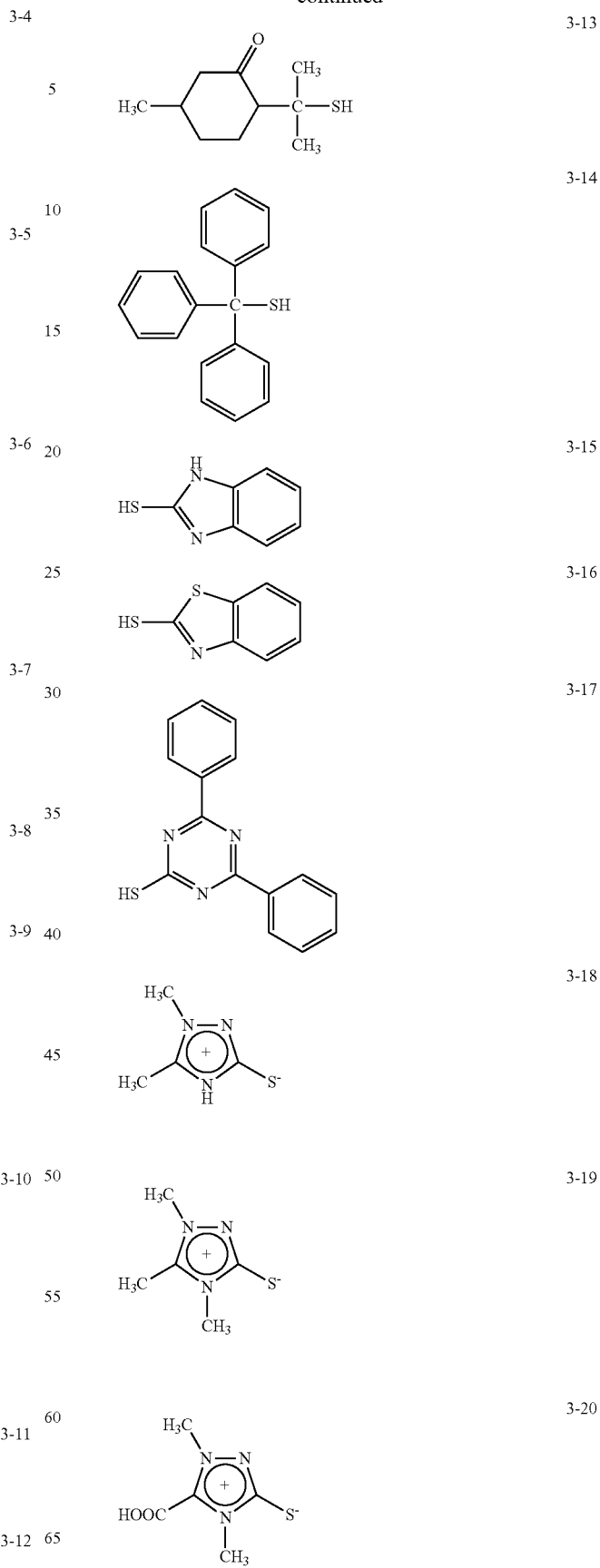

-continued 3-21
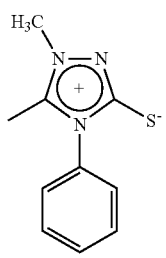

3-22
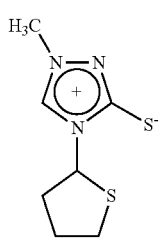

3-23
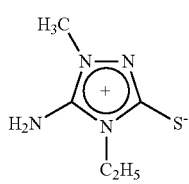

[Chemical Formula 22]

4-1
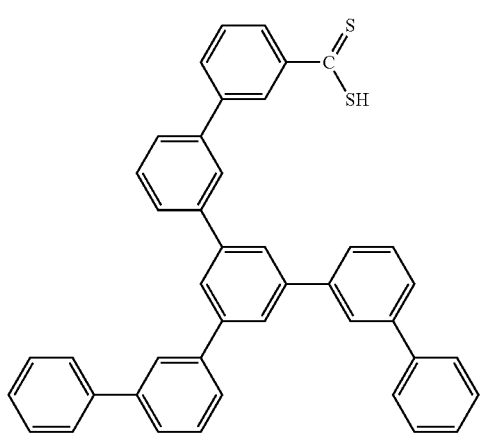

(1-4) Polymer Having Sulfur Atoms

In the present invention, a polymer can be used as the organic compound having sulfur atom(s).

It is preferable that the polymer having sulfur atoms has a weight average molecular weight in the range of from 1,000 to 1,000,000.

Specific examples (PS 1 to 14) of the monomer for constituting the polymer having sulfur atoms will be indicated below, but the examples are not limited to these.

In addition, the polymer having sulfur atoms is constituted by the monomer shown below at a repeating number in the range at which the weight average molecular weight becomes 1,000 to 1,000,000. Furthermore, the numerical value attached to the outside of the brackets represents the constitutional ratio of the respective monomer units (also referred to as a molar ratio or a composition ratio).

[Chemical Formula 23]

PS1
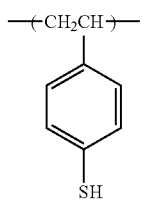

PS2
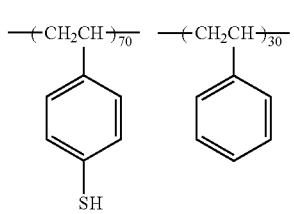

PS3
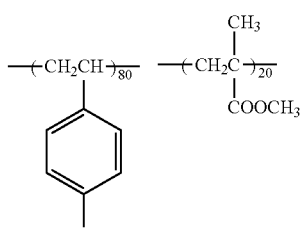

PS4
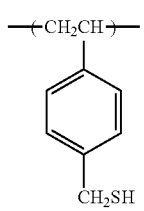

PS5
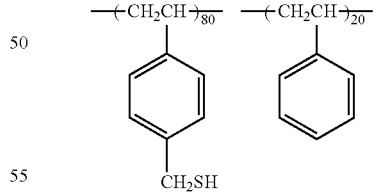

PS6
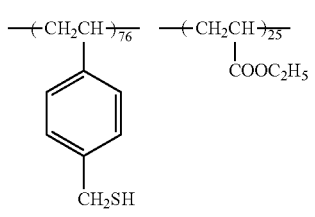

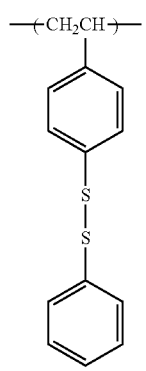
PS7

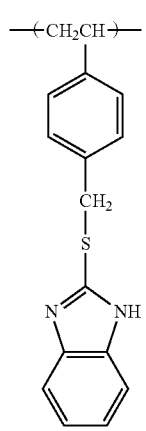
PS8

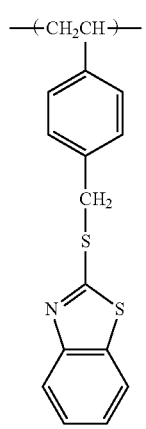
PS9

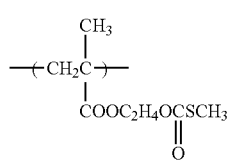
PS10

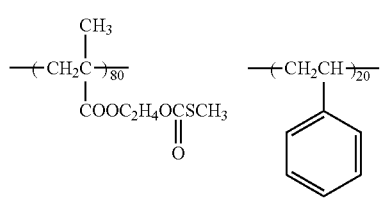
PS11

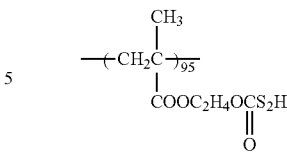 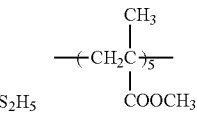

PS12

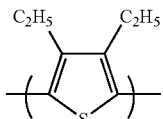
PS13

PS14

The weight average molecular weights of the polymers formed of the above-mentioned monomer units are shown in Table 2.

TABLE 2

| Polymer containing sulfur atoms | Weight average molecular weight Mw |
|---|---|
| PS1 | 2000 |
| PS2 | 4000 |
| PS3 | 10000 |
| PS4 | 150000 |
| PS5 | 50000 |
| PS6 | 7000 |
| PS7 | 6000 |
| PS8 | 5000 |
| PS9 | 10000 |
| PS10 | 100000 |
| PS11 | 70000 |
| PS12 | 50000 |
| PS13 | 1000 |
| PS14 | 6000 |

The organic compound and polymer having sulfur atom (s) used in the present invention can be synthesized by a known or well-known method.

The weight average molecular weight of the polymer having nitrogen atoms or sulfur atoms used in the present invention is a value obtained by performing a measurement under the following measurement conditions at room temperature (25° C.).

(Measurement Conditions)
Device: high-speed GPC device HLC-8220GPC, Tosoh Corporation
Column: TOSOH TSK gel Super HM-M
Detector(s): RI and/or UV
Flow velocity of eluate: 0.6 ml/min
Temperature: 30° C.
Sample concentration: 0.1 mass %
Sample amount: 100 μl
Standard curve: prepared by using standard polystyrene (A standard curve (also referred to as a calibration curve) was prepared by using 13 samples of standard polystyrenes, STK Standard Polystyrenes (manufactured by Tosoh Corporation) with Mw=500 to 1,000,000, and used for calculating the weight average molecular weight of a substance to be measured. The weight average molecular weights of the polystyrenes used as the samples were preset to give approximately equal intervals.)

(2) Electrode Layer

It is preferable that the electrode layer 101b is a layer that is comprised by using silver or an alloy containing silver as a major component and formed by film formation on the primer layer 101a.

As such method for film formation of the electrode layer 101b, methods using wet processes such as an application process, an inkjet process, a coating process and a dip process, methods using dry processes such as deposition processes (resistant heating, an EB process and the like), a sputtering process and a CVD process, and the like are exemplified. Among these, the deposition process is preferably applied.

Furthermore, although the electrode layer 101b is characterized in that it has sufficient electroconductivity without a high temperature annealing process and the like after the film formation of the electrode layer 101b, by being formed on the primer layer 101a, a high temperature annealing process and the like may be conducted after the film formation as necessary.

Examples of the alloy containing silver (Ag) as a major component which constitutes the electrode layer 101b include silver-magnesium (AgMg), silver-copper (AgCu), silver-palladium (AgPd), silver-palladium-copper (AgPdCu), silver-indium (AgIn) and the like.

Furthermore, it is also preferable to perform co-deposition by adding about 2 atom number % of aluminum (Al) or gold (Au) to silver.

Where necessary, the electrode layer 101b as mentioned above may have a constitution in which the layer of silver or an alloy containing silver as a major component is divided into plural layers and stacked.

Furthermore, this electrode layer 101b preferably has a layer thickness within the range of from 5 to 30 nm. In the case when the layer thickness is thinner than 30 nm, the absorbable component or reflectable component in the layer is small, and thus the transmittance of the first transparent electrode 101 increases. Furthermore, in the case when the layer thickness is thicker than 5 nm, the electroconductivity of the layer can be sufficiently ensured. The layer thickness is preferably in the range of from 8 to 20 nm, more preferably in the range of from 10 to 15 nm.

Furthermore, by suitably changing the layer thicknesses of the metal layers of the first transparent electrode and the second transparent electrode, the light distribution properties at the side of the first transparent electrode and the side of the second transparent electrode can be freely controlled while maintaining a small color shift (for example, see Example 3).

In addition, in the first transparent electrode 101 having the stacked structure formed of the primer layer 101a and the electrode layer 101b formed thereon as mentioned above, the upper part of the electrode layer 101b may be covered with a protection film, or another electrode layer may be stacked on the electrode layer 101b. In this case, it is preferable that the protection film and another electrode layer have a light transmission property so that the light transmission property of the first transparent electrode 101 is not lost.

(3) Effect of First Transparent Electrode

The first transparent electrode 101 having the constitution as mentioned above has, for example, a constitution in which the electrode layer 101b formed of silver or an alloy containing silver as a major component is disposed on the primer layer 101a comprised by using the organic compound having at least one kind of atom selected from a nitrogen atom and a sulfur atom. By this way, during the film formation of the electrode layer 101b on the upper part of the primer layer 101a, the silver atoms constituting the electrode layer 101b interact with the compound containing a nitrogen atom or a sulfur atom constituting the primer layer 101a, and the diffusion distance of the silver atoms on the surface of the primer layer 101a is decreased, and thus the aggregation of the silver is suppressed.

Meanwhile, in general, since a thin film grows in a nucleation growth type (Volumer-Weber: VW type) in the film formation of the electrode layer 101b containing silver as a major component, the silver particles are easily isolated in insular shapes, and thus it is difficult to obtain electroconductivity when the layer thickness is thin, and the sheet resistance value increases. Therefore, it is necessary to increase the layer thickness in order to ensure electroconductivity, but the light transmittance is decreased when the layer thickness is increased, and thus the electrode layer was difficult to be used as a transparent electrode.

However, according to the first transparent electrode 101 in the present invention, since the aggregation of silver is suppressed on the primer layer 101a as mentioned above, a thin film grows in a single layer growth type (Frank-van der Merwe: FM type) in the film formation of the electrode layer 101b, which is formed of silver or an alloy containing silver as a major component.

Furthermore, it is preferable that the first transparent electrode 101 is a transparent electrode having a light transmittance at a wavelength of 550 nm of 50% or more, and the electrode layer 101b formed of silver or an alloy containing silver as a major component can be thinned and thus can be a film having a sufficiently fine light transmittance by disposing the primer layer 101a. On the other hand, the electroconductivity of the first transparent electrode 101 is ensured mainly by the electrode layer 101b. The electrode layer 101b formed of silver or an alloy containing silver as a major component is excellent in electroconductivity, and the electroconductivity is ensured at a thinner layer thickness, Therefore, it becomes possible to attain improvement of the electroconductivity of the first transparent electrode 101 and improvement of the light transmission property of the first transparent electrode 101 at the same time.

Furthermore, the first transparent electrode in the present invention can be adjusted to be a thin film to the extent that mirror surface reflection on the silver electrode does not occur, and thus can contribute to the improvement of the light emission luminance.

[Organic Light-Emitting Layer]

(1) Light-Emitting Layer

The organic light-emitting layer 103 includes at least a light-emitting layer 103c.

It is preferable that the light-emitting layer 103c used in the present invention contains a phosphorescent light-emitting compound as a light-emitting material. In addition, a fluorescent material may be used as the light-emitting material, or the phosphorescent light-emitting compound and the fluorescent material may be used in combination.

This light-emitting layer 103c is a layer in which light is emitted by the re-bonding of electrons that are injected from the electrode or electron transport layer 103d and holes that are injected from the hole transport layer 103b, and the part where light is emitted may be either in the layer of the light-emitting layer 103c or at the interface between the light-emitting layer 103c and the adjacent layer.

The constitution of such light-emitting layer 103c is not specifically limited as long as the light-emitting material included therein satisfies requirements of light emission. Furthermore, there may be plural layers having the same light emission spectrum and the same light emission maximum wavelength. In this case, it is preferable that each of the light-emitting layers 103c has a non-light-emitting intermediate layer (illustration is omitted) therebetween.

The sum of the layer thicknesses of the light-emitting layers 103c is preferably in the range of from 1 to 100 nm, and more preferably in the range of from 1 to 30 nm since a lower driving voltage can be obtained.

In the case when non-light-emitting intermediate layers are present between the light-emitting layers 103c, the sum of the layer thicknesses of the light-emitting layers 103c is a layer thickness including the intermediate layers.

In the case of the light-emitting layers 103c having a constitution in which plural layers are stacked, the layer thickness of the individual light-emitting layer is preferably adjusted to be within the range of from 1 to 50 nm, more preferably adjusted to be within the range of from 1 to 20 nm. In the case when the stacked plural light-emitting layers correspond to respective colors of light emission of blue, green and red, the relationship of the layer thicknesses of the respective light-emitting layers of blue, green and red is not specifically limited.

The light-emitting layer 103c as mentioned above can be formed by film formation of a light-emitting material and a host compound, which are mentioned below, by a method for forming thin film such as, vacuum vapor deposition, a spin coat process, a cast thin film process, An LB process or an inkjet process.

The light-emitting dopant (also referred to as a light-emitting dopant compound) and the host compound contained in the light-emitting layer will be explained.

(1-1) Host Compound

Among the compounds contained in the light-emitting layer, the host compound in the present invention is defined as a compound having a mass ratio in that layer of 20% or more and having a phosphorescence quantum yield of phosphorescence at room temperature (25° C.) of less than 0.1. Preferably, the phosphorescence quantum yield is less than 0.01. Furthermore, it is preferable that the host compound has a volume ratio in the light-emitting layer of 20% or more in the compounds contained in that layer.

As the host compound, a known host compound can be used singly, or plural kinds of known host compounds can be used in combination. It is possible to adjust the transfer of the electrical charge by using plural kinds of host compounds, and the efficiency of an organic EL element can be increased. Furthermore, it becomes possible to mix different emitted light by using plural kinds of light-emitting dopants mentioned below, whereby an arbitrary color of light emission can be obtained.

The light-emitting host used in the present invention may be either a conventionally-known low molecular weight compound or a polymer compound having repeating units, or a low molecular weight compound having a polymerizable group such as a vinyl group or an epoxy group (deposition-polymerizable light-emitting host).

As the known host compound that may be used in combination, a compound that has hole transportability and electron transportability, and prevents the increase in the wavelength of light emission and has a high Tg (glass transition temperature) is preferable.

Specific examples of the known host compound include, but are not limited to, the compounds described in the following documents.

JP 2001-257076 A, JP 2002-308855, JP 2001-313179, JP 2002-319491 A, JP 2001-357977 A, JP 2002-334786 A, JP 2002-8860 A, JP 2002-334787 A, JP 2002-15871 A, JP 2002-334788 A, JP 2002-43056 A, JP 2002-334789 A, JP 2002-75645 A, JP 2002-338579 A, JP 2002-105445 A, JP 2002-343568 A, JP 2002-141173 A, JP 2002-352957 A, JP 2002-203683 A, JP 2002-363227 A, JP 2002-231453 A, JP 2003-3165 A, JP 2002-234888 A, JP 2003-27048 A, JP 2002-255934 A, JP 2002-260861 A, JP 2002-280183 A, JP 2002-299060 A, JP 2002-302516 A, JP 2002-305083 A, JP 2002-305084 A, JP 2002-308837 A and the like.

(1-2) Light-Emitting Dopant

The light-emitting dopant used in the present invention will be explained.

From a viewpoint of obtaining an organic EL element having a higher light emission efficiency, it is preferable that the light-emitting layer of the organic EL element of the present invention simultaneously contains the above-mentioned host compound and a phosphorescent dopant.

(1-2-1) Phosphorescent Dopant

The phosphorescent dopant used in the present invention is a compound in which light emission from an excited triplet is observed, and is specifically defined as a compound that emits phosphorescent light at room temperature (25° C.) and has a phosphorescence quantum yield of 0.01 or more at 25° C., and a preferable phosphorescence quantum yield is 0.1 or more.

The above-mentioned phosphorescence quantum yield can be measured by the method described in Experimental Chemistry 7, $4^{th}$ edition, Spectroscopy II, page 398 (1992 edition, Maruzen). The phosphorescence quantum yield in the solution can be measured by using various solvents, and in the phosphorescent dopant used in the present invention, it is sufficient that the above-mentioned phosphorescence quantum yield (0.01 or more) is achieved in any optional solvent.

There are two kinds of principles of the light emission of a phosphorescent compound. One is an energy transfer type in which an excitation state of a host compound in which a carrier is transferred is generated on the host compound by the re-bonding of the carrier, and the energy thereof is transferred to a phosphorescent dopant, whereby light emission from the phosphorescent dopant is obtained, and the other is a carrier trap type in which re-bonding of a carrier occurs on a phosphorescent dopant by the action of the phosphorescent dopant as a carrier trap, whereby light emission from the phosphorescent dopant is obtained. In either case, the condition is such that the energy of the excited state of the phosphorescent dopant is lower than the energy of the excited state of the host compound.

Specific examples of the known phosphorescent dopants that can be used in the present invention include the compounds described in the following documents, and the like.

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991 A, WO 2008/101842 A, WO 2003/040257 A, US 2006/835469 A, US 2006/0202194 A, US 2007/0087321 A, US 2005/0244673 A, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290 A, WO 2002/015645 A, WO 2009/000673 A, US 2002/0034656 A, U.S. Pat. No. 7,332,232 B, US 2009/0108737 A, US 2009/0039776 A, U.S. Pat. Nos. 6,921,915 B, 6,687,266 B, US 2007/0190359 A, US 2006/0008670 A, US 2009/0165846

A, US 2008/0015355 A, U.S. Pat. Nos. 7,250,226 B, 7,396, 598 B, US 2006/0263635 A, US 2003/0138657 A, US 2003/0152802 A, U.S. Pat. No. 7,090,928 B, Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714 A, WO 2006/009024 A, WO 2006/056418 A, WO 2005/019373 A, WO 2005/123873 A, WO 2005/123873 A, WO 2007/004380 A, WO 2006/082742 A, US 2006/0251923 A, US 2005/0260441 A, U.S. Pat. Nos. 7,393,599 B, 7,534,505 B, 7,445,855 B, US 2007/0190359 A, US 2008/0297033 A, U.S. Pat. No. 7,338,722 B, US 2002/0134984 A, U.S. Pat. No. 7,279,704 B, US 2006/098120 A, US 2006/103874 A, WO 2005/076380 A, WO 2010/032663 A, WO 2008/140115 A, WO 2007/052431 A, WO 2011/134013 A, WO 2011/157339 A, WO 2010/086089 A, WO 2009/113646 A, WO 2012/020327 A, WO 2011/051404 A, WO 2011/004639 A, WO 2011/073149 A, US 2012/228583 A, US 2012/212126 A, JP 2012-069737 A, JP2011-181303 A, JP2009-114086 A, JP2003-81988 A, JP 2002-302671 A, JP 2002-363552 A and the like.

Among these, preferable phosphorescent dopants include organic metal complexes each having Ir as a center metal. More preferably, complexes having at least one coordination form(s) among a metal-carbon bond, a metal-nitrogen bond, a metal-oxygen bond and a metal-sulfur bond are preferable.

In the organic EL element 100, at least one of the light-emitting layers 103c may contain two or more kinds of phosphorescent light-emitting compounds, and the concentration ratio of the phosphorescent light-emitting compounds in the light-emitting layer 103c may change in the thickness direction of the light-emitting layer 103c.

The phosphorescent light-emitting compound is preferably 0.1 volume % or more and less than 30 volume % with respect to the total amount of the light-emitting layers 103c.

(1-2-2) Fluorescent Compound

As the fluorescent compound, coumarin-based dyes, pyran-based dyes, cyanine-based dyes, chloconium-based dyes, squarylium-based dyes, oxobenzoanthracene-based dyes, fluorescein-based dyes, rhodamine-based dyes, pyrylium-based dyes, perylene-based dyes, stilbene-based dyes, polythiophene-based dyes or rare earth complex-based phosphors and the like are exemplified.

(2) Injection Layers (Hole Injection Layer, Electron Injection Layer)

The injection layer is a layer that is disposed between the electrode and the light-emitting layer 103c for decreasing the driving voltage and for improving the light emission luminance, and is described in detail in "Organic EL Elements And Industrialization Front Line Thereof (Nov. 30, 1998, published by NTS)", 2$^{nd}$ edition, Section 2, "Electrode Material" (pages 123 to 166), and there are a hole injection layer 103a and an electron injection layer 103e.

The injection layer can be provided as necessary. The hole injection layer 103a may be allowed to present between the anode and the light-emitting layer 103c or the hole transport layer 103b, and the electron injection layer 103e may be allowed to present between the cathode and the light-emitting layer 103c or the electron transport layer 103d.

The details of the hole injection layer 103a are also described in JP 9-45479 A, JP 9-260062 A and JP 8-288069 A and the like, and specific examples include phthalocyanine layers as represented by copper phthalocyanine, oxide layers as represented by vanadium oxide, amorphous carbon layers, polymer layers using electroconductive polymers such as polyaniline (emeraldine) and polythiophene, and the like.

The details of the electron injection layer 103e are also described in JP 6-325871 A, JP 9-17574 A and JP 10-74586 A and the like, and specific examples include metal layers as represented by strontium, aluminum and the like, alkali metal halide layers as represented by potassium fluoride, alkali earth metal compound layers as represented by magnesium fluoride, oxide layers as represented by molybdenum oxide, and the like. It is desirable that the electron injection layer 103e in the present invention is a quite thin film, and the layer thickness thereof is preferably within the range of from 1 nm to 10 μm depending on the material thereof.

(3) Hole Transport Layer

The hole transport layer 103b is formed of a hole transport material that has a function to transport holes, and the hole injection layer 103a and the electron blocking layer are also encompassed in the hole transport layer 103b in a broad sense. The hole transport layer 103b can be provided as a single layer or plural layers.

The hole transport material has either a property to inject or transport holes, or a barrier property against electrons, and may either an organic substance or an inorganic substance. Examples include triazole derivatives, oxadiazole derivatives, imidazole derivatives, polyarylalkane derivatives, pyrazoline derivatives and pyrazolone derivatives, phenylenediamine derivatives, arylamine derivatives, amino-substituted calcone derivatives, oxazole derivatives, styrylanthracene derivatives, fluorenone derivatives, hydrazone derivatives, stilbene derivatives, silazane derivatives, aniline-based copolymers, oligomers of electroconductive polymers, specifically thiophene oligomer, and the like.

As the hole transport material, the above-mentioned hole transport materials can be used, and it is preferable to use porphyrin compounds, aromatic tertiary amine compounds and styrylamine compounds, specifically aromatic tertiary amine compounds.

Typical examples of the aromatic tertiary amine compound and styrylamine compounds include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis (4-di-p-tolylaminophenyl)propane; 1,1-bis(4-di-p-tolylaminophenyl)cyclohexane; N,N,N',N'-tetra-p-tolyl-4, 4'-diaminobiphenyl; 1,1-bis(4-di-p-tolylaminophenyl)-4-phenylcyclohexane; bis(4-dimethylamino-2-methylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino) quadryphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N, N-diphenylaminostilbenzene; N-phenylcarbazole, and those having two condensed aromatic rings in the molecule described in U.S. Pat. No. 5,061,569 B such as 4,4'-bis[N-(1-naphthyl)-N-phenylamino]biphenyl (NPD), 4,4',4"-tris [N-(3-methylphenyl)-N-phenylamino]triphenylamine (MT-DATA) in which three triphenylamine units are connected in a starburst form described in JP 4-308688 A, and the like.

Furthermore, polymer materials in which these materials are introduced in the polymer chain or using these materials as the polymer main chain can also be used. Furthermore, inorganic compounds such as p-type-Si and p-type-SiC can also be used as the hole injection material and the hole transport material.

Furthermore, so-called p-type hole transport materials as described in JP 11-251067 A and J. Huang et. al., Applied Physics Letters, 80 (2002), p. 139 can also be used. In the present invention, it is preferable to use these materials since a light-emitting element having a higher efficiency can be obtained.

The hole transport layer 103b can be formed by forming the above-mentioned hole transport material into a thin film by a known method such as a vacuum vapor deposition process, a spin coat process, a cast process, a printing process including an inkjet process or an LB process. The layer thickness of the hole transport layer 103b is not specifically limited, and is generally within the range of from about 5 nm to 5 μm, preferably from 5 to 200 nm. This hole transport layer 103b may have a single layer structure formed of one kind or two or more kinds of the above-mentioned materials.

Furthermore, the p-property can be increased by doping the material of the hole transport layer 3b with an impurity. The examples thereof include those described in JP 4-297076 A, JP2000-196140 A and JP 2001-102175 A, J. Appl. Phys., 95, 5773 (2004), and the like.

It is preferable to increase the p-property of the hole transport layer 103b by this way since an element that consumes a lower electrical power can be prepared.

(4) Electron Transport Layer

The electron transport layer 103d is formed of a material having a function to transport electrons, and the electron injection layer 103e and the hole blocking layer (illustration is omitted) are also encompassed in the electron transport layer 103d in a broad sense. The electron transport layer 103d can be provided as a single layer structure or a stack structure of plural layers.

In the electron transport layer 103d having a single layer structure and the electron transport layer 103d having a stacked structure, as the electron transport material that constitutes the layer part that is adjacent to the light-emitting layer 103c (this also serves as a hole blocking material), it is sufficient to have a function to transmit electrons that are injected from the cathode to the light-emitting layer 103c. Such material can be optionally selected from conventionally-known compounds and used. Examples include nitro-substituted fluorene derivatives, diphenylquinone derivatives, thiopyrandioxide derivatives, carbodiimide, fluorenylidenemethane derivatives, anthraqunodimethane, anthrone derivatives and oxadiazole derivatives, and the like. Furthermore, in the above-mentioned oxadiazole derivatives, thiadiazole derivatives in which the oxygen atom of the oxadiazole ring has been substituted with a sulfur atom, and quinoxaline derivatives having a quinoxaline ring, which is known as an electron withdrawing group, can also be used as the materials for the electron transport layer 103d. In addition, polymer materials in which these materials have been introduced in the polymer chain, or polymer materials using these materials as the polymer main chain can also be used.

Furthermore, metal complexes of 8-quinolinol derivatives such as tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and the like, and metal complexes in which the center metals in these metal complexes have been replaced with In, Mg, Cu, Ca, Sn, Ga or Pb can also be used as the materials for the electron transport layer 103d.

In addition, metal-free or metal phthalocyanines, or metal-free or metal phthalocyanines whose terminals have been substituted with alkyl groups, sulfonic acid groups or the like can also be preferably used as the materials for the electron transport layer 103d. Furthermore, distyrylpyrazine derivatives, which are also used as the materials for the light-emitting layer 103c, can also be used as the materials for the electron transport layer 103d, and inorganic semiconductors such as n-type-Si and n-type-SiC can also be used as the materials for the electron transport layer 103d as in the hole injection layer 103a and hole transport layer 103b.

The electron transport layer 103d can be formed by forming the above-mentioned material into a thin film by a known method such as a vacuum vapor deposition process, a spin coat process, a cast process, print processes including an inkjet process or an LB process. The layer thickness of the electron transport layer 103d is not specifically limited, and is generally within the range of from about 5 nm to 5 μm, preferably from 5 to 200 nm. The electron transport layer 103d may also be a single layer structure formed of one kind or two or more kinds of the above-mentioned materials.

Furthermore, the electron transport layer 103d can be doped with an impurity to increase the n-property. Examples thereof include those described in JP 4-297076 A, JP 10-270172 A, JP 2000-196140 A, JP 2001-102175 A, J. Appl. Phys., 95, 5773 (2004) and the like. Furthermore, it is also preferable that the electron transport layer 103d contains potassium, a potassium compound or the like. As the potassium compound, for example, potassium fluoride and the like can be used. By increasing the n-property of the electron transport layer 103d by this way, an element that consumes a lower electrical power can be prepared.

Furthermore, as the material (electron transporting compound) for the electron transport layer 103d, a material that is similar to the material that constitutes the above-mentioned primer layer 101a can be used. The same applies to the electron transport layer 103d that also acts as the electron injection layer 103e, and a material that is similar to the material that constitutes the above-mentioned primer layer 101a may also be used.

(5) Blocking Layers (Hole Blocking Layer, Electron Blocking Layer)

As mentioned above, the blocking layer is provided as necessary besides the elemental constitution layers of the organic light-emitting layer 103. Examples include the hole block layers described in JP 11-204258 A and JP 11-204359 A, and page 237 of "Organic EL Elements And Industrialization Front Line Thereof (Nov. 30, 1998, published by NTS)", and the like.

The hole blocking layer has the function of the electron transport layer 103d in a broad sense. The hole blocking layer is formed of a hole blocking material that has a function to transport electrons and a significantly small ability to transport holes, and thus can improve the probability of the re-bonding of electrons and holes by blocking holes while transporting electrons. Furthermore, the constitution of the electron transport layer 103d can be used as the hole blocking layer as necessary. It is preferable that the hole blocking layer is provided adjacent to the light-emitting layer 103c.

On the other hand, the electron blocking layer has the function of the hole transport layer 103b in a broad sense. The electron blocking layer is formed of a material that has a function to transport holes and a significantly small ability to transport electrons, and thus can improve the probability of the re-bonding of electrons and holes by blocking electrons while transporting holes. Furthermore, the constitution of the hole transport layer 103b can be used as the electron blocking layer as necessary. The layer thickness of the hole blocking layer is preferably within the range of from 3 to 100 nm, further preferably within the range of from 5 to 30 nm.

As the film formation of the respective layers of the hole injection layer 103a, the hole transport layer 103b, the light-emitting layer 103c, the electron transport layer 103d and the electron injection layer 103e mentioned above, a spin coat process, a cast process, an inkjet process, a deposition process, a printing process and the like are exemplified, and a vacuum vapor deposition process or a spin coating process is specifically preferable from the points that a homogeneous film is easily obtained and pinholes are difficult to be formed. Furthermore, different film formation processes may be applied to every layer. In the case when a deposition process is adopted for the film formation of these respective layers, the deposition conditions differ depending on the kinds of the compounds used, and the like, and it is generally desirable to suitably select the respective conditions within the ranges of: a boat heating temperature of from 50 to 450° C., a vacuum degree of from $1 \times 10^{-6}$ to $1 \times 10^{-2}$ Pa, a deposition velocity of from 0.01 to 50 nm/sec, a substrate temperature of from −50 to 300° C. and a layer thickness of from 0.1 to 5 μm.

[Second Transparent Electrode (Counter Electrode)]

The second transparent electrode 102 is an electrode film that functions as a cathode for supplying electrons to the organic light-emitting layer 103, and metals, alloys, organic or inorganic electroconductive compounds, and mixtures thereof are used.

The first transparent electrode and the second transparent electrode in the present invention are comprised by material(s) selected from an identical group of materials. That "comprised by material(s) selected from an identical group of materials" means that the material(s) selected from the following group of materials is/are used for the electrodes. Specifically, from the viewpoint of easy designing of two-side light emission, it is preferable that the first transparent electrode and the second transparent electrode are respectively comprised by an identical material.

The group of materials that can be used in the first transparent electrode include aluminum, silver, magnesium, lithium, magnesium/copper mixture, magnesium/silver mixture, magnesium/aluminum mixture, magnesium/indium mixture, indium, lithium/aluminum mixture, rare earth metals, oxide semiconductors such as ITO, ZnO, $TiO_2$ and $SnO_2$, and the like.

Specifically, the second transparent electrode 102 is preferably a layer comprised by using silver or an alloy containing silver as a major component in a similar manner to that for the first transparent electrode 101.

As the method for the film formation of the electrode layer of such second transparent electrode 102, methods using wet processes such as an application process, an inkjet process, a coating process and a dipping process, and methods using dry processes such as deposition processes (resistant heating, an EB process and the like), a sputtering process and a CVD process, and the like are exemplified. Among these, the deposition process is preferably applied.

Examples of the alloy containing silver (Ag) as a major component which constitutes the electrode layer include silver-magnesium (AgMg), silver-copper (AgCu), silver-palladium (AgPd), silver-palladium-copper (AgPdCu), silver-indium (AgIn) and the like.

Furthermore, it is also preferable to perform co-deposition by adding about 2 atom number % of aluminum (Al) or gold (Au) to silver.

The electrode layer as mentioned above may have a constitution in which a layer of silver or an alloy containing silver as a major component is divided into plural layers and stacked as necessary.

Furthermore, it is preferable that this electrode layer has a layer thickness in the range of from 5 to 30 nm. In the case when the layer thickness is thinner than 30 nm, the absorption component or reflection component of the layer is small, and the transmittance of the second transparent electrode 102 increases. Furthermore, in the case when the layer thickness is thicker than 5 nm, the electroconductivity of the layer can be sufficiently ensured. The layer thickness is preferably in the range of from 8 to 20 nm, further preferably in the range of from 10 to 15 nm.

As mentioned above, by suitably changing the layer thicknesses of the metal layers of the first transparent electrode and the second transparent electrode, the light distribution properties at the side of the first transparent electrode and side of the second transparent electrode can be freely controlled while maintaining a small color shift.

[Extraction Electrode (not Depicted)]

The extraction electrode electrically connects the first transparent electrode 101 and the second transparent electrode 102 and an outer power source, and the material thereof is not specifically limited, and known materials are preferably used. For example, metal films such as a MAM electrode (Mo/Al—Nd alloy/Mo) formed of a three-layer structure can be used.

[Auxiliary Electrode (not Illustrated)]

The auxiliary electrode is provided for the purpose of decreasing the resistances of the first transparent electrode 101 and second transparent electrode 102, and is preferably disposed in contact with the electrode layer 101b of the first transparent electrode 101 and the electrode layer of the second transparent electrode 102. As the material for forming the auxiliary electrode, metals having a low resistance such as gold, platinum, silver, copper and aluminum are preferable. Since these metals have a low light transmission property, a pattern is formed in the scope that is not affected by the extraction of the emitted light h from the light extraction surface.

As the method for forming such auxiliary electrode 15, a deposition process, a sputtering process, a printing process, an inkjet process, an aerosol jet process and the like are exemplified. The line width of the auxiliary electrode is preferably 50 μm or less from the viewpoint of an aperture ratio for extraction of light, and the thickness of the auxiliary electrode is preferably 1 μm or more from the viewpoint of electroconductivity.

[Electrode Protective Layer]

As at least one layer of the transparent functional layer in the present invention, it is preferable to form an electrode protective layer 104 containing an organic or inorganic compound between the second transparent electrode 102 and the transparent sealing substrate 105 so as to make the surface of the second transparent electrode smooth and to make the mechanical protection sufficient. Furthermore, the adhesive strength is high since solid sealing is conducted in laminating a transparent sealing substrate.

It is preferable that the electrode protective layer 104 as mentioned above has flexibility, and a thin type polymer film or a thin type metal film can be used. A layer formed by the above-mentioned application process or deposition process by suitably selecting the organic compound used in the above-mentioned primer layer or organic light-emitting layer, is also preferable. The preferable layer thickness may be suitably preset depending on the purpose, and for example, the layer thickness is preferably from about 10 nm to 10 μm, more preferably from about 15 nm to 1 μm, and further preferably in the range of from 20 to 500 nm.

[Transparent Sealing Substrate]

The transparent sealing substrate 105 in the present invention is comprised by a material that has flexibility and is selected from a group of materials which is identical with a group of materials for the above-mentioned transparent substrate 110, and the function thereof is laminate sealing of the organic EL element 100. As shown in the illustrated example, for example, the transparent sealing substrate 105 is fixed on the side of the electrode protective layer 104 and the side of the transparent substrate 110 by an adhesive layer containing an adhesive (not illustrated). Such transparent sealing substrate 105 is disposed in the state that the terminal parts of the first transparent electrode 101 and the second transparent electrode 102 of the organic EL element 100 are exposed, and that at least the organic light-emitting layer 103 is completely covered.

Both of the transparent substrate 110 and the transparent sealing substrate 105 in the present invention have flexibility and are comprised by material(s) selected from an identical group of materials. That "comprised by material(s) selected from an identical group of materials" means that the material(s) selected from the following group of materials is/are used as the resin substrates, and material(s) selected from a group of materials which is identical with the group of materials for the transparent substrate 110 is/are used. Specifically, from the viewpoint of making the designing of two-side light emission easy, it is preferable that the transparent substrate and the transparent sealing substrate are respectively comprised by an identical material.

Furthermore, it is preferable that the transparent sealing substrate 105 is basically comprised by a transparent resin substrate as a substrate and one or more gas barrier layer(s) each having a refractive index at a light wavelength of 550 nm in the scope of from 1.4 to 1.7. In this case, it is preferable to use an identical material also in the formation of the gas barrier layer.

(1) Resin Substrate

The resin substrate used in the present invention is a transparent and flexible resin substrate. It is preferable that the resin substrate that is preferably used in the present invention has a humidity resistance/gas barrier performances such as gas permeation resistance that are required for an organic EL element.

In the present invention, the light transmittance at a light wavelength of 550 nm of the resin substrate is preferably 70% or more, more preferably 80% or more, further preferably 90% or more.

In the present invention, the group of the materials that form the transparent resin substrate refers to acrylic resin films such as acrylic acid esters, methacrylic acid esters and PMMA, respective resin films of polyethylene telephthalates (PET), polybutyrene telephthalates, polyethylene naphthalates (PEN), polycarbonates (PC), polyarylates, polyvinyl chlorides (PVC), polyethylenes (PE), polypropylenes (PP), polystyrenes (PS), nylons (Ny), aromatic polyamides, polyether ether ketones, polysulfones, polyethersulfonates, polyimides, polyetherimides, polyolefins and epoxy resins, respective resin films of cycloolefin-based resins and cellulose ester-based resins, heat-resistant transparent films having a silsesquioxane having an organic-inorganic hybrid structure as an elemental backbone (product name: Sila-DEC, manufactured by Chisso Corporation), and resin films formed by stacking two or more layers of the above-mentioned resin materials, and the like.

As the resin substrate in the present invention, in view of costs and easiness in acquiring, polyethylene telephthalates (PET), polyethylene naphthalates (PEN), polycarbonates (PC), acrylic resins and the like are preferably used.

Among these, biaxially-drawn polyethylene telephthalate (PET) films and biaxially-drawn polyethylene naphthalate (PEN) films are preferable in view of transparency, heat resistance, easiness of handling, strength and costs.

Furthermore, low heat shrink-treated articles that have undergone treatments such as heat annealing are the most preferable so as to maximally suppress the shrinking during thermal expansion.

The thickness of the resin substrate is preferably in the range of from 10 to 500 μm, more preferably in the range of from 20 to 250 μm, and further preferably in the range of from 30 to 150 μm. Since the thickness of the resin substrate is in the range of from 10 to 500 μm, a stable gas barrier property can be obtained, and the resin substrate becomes suitable for conveyance by a roll-to-roll system.

(2) Gas Barrier Layer

As the gas barrier layer, it is preferable to provide a gas barrier layer that is identical with that of the transparent substrate 110 from the viewpoint of the control of the refractive index, and a gas barrier layer obtained by applying an application liquid containing at least one layer of an inorganic precursor compound on a resin substrate, and then subjecting the resin substrate to a modification treatment by irradiating vacuum ultraviolet ray is preferable. Specifically, a layer obtained by applying an application liquid containing a polysilazane, and subjecting the polysilazane to a treatment for modifying into silicon oxide by irradiating vacuum ultraviolet ray is preferable.

(3) Laminate Sealing Method

The method for performing laminate sealing by the transparent sealing substrate 105 is not specifically limited, and the method is conducted, for example, as follows. The above-mentioned organic EL element 100 is put under a circumstance in which the oxygen and water content concentrations are constant (for example, in a glove box with an oxygen concentration of 10 ppm or less and a water content concentration of 10 ppm or less or the like) and pressed by pressurization with aspirating under a reduced pressure ($1 \times 10^{-3}$ MPa or less), whereby the organic EL element 100 is laminate-sealed by the adhesive layer formed on the transparent sealing substrate 105, and the adhesive layer is then subjected to thermal curing by heating by a hot air circulation oven, an infrared ray heater, a heat gun, a high frequency wave induction heater, pressure bonding with a heat tool, or the like.

The adhesive is not specifically limited, and various thermosetting resins such as epoxy resins, cyanate ester resins, phenolic resins, bismaleimide-triazine resins, polyimide resins, acrylic resins and vinylbenzyl resins are specifically preferable. Among these, epoxy resins are preferable in view of low temperature curability, tackiness and the like.

The epoxy resin may be any one as long as it has two or more epoxy groups per one molecule in average, and specific examples include bisphenol A-type epoxy resins, biphenyl-type epoxy resins, biphenylaralkyl-type epoxy resins, naphthol-type epoxy resins, naphthalene-type epoxy resins, bisphenol F-type epoxy resins, phosphorus-containing epoxy resins, bisphenol S-type epoxy resins, aromatic glycidylamine-type epoxy resins (specifically tetraglycidyl-diaminodiphenylmethane, triglycidyl-p-aminophenol, diglycidyltoluidine, diglycidylaniline and the like), alicyclic epoxy resins, aliphatic chain epoxy resins, phenol novolak-type epoxy resins, cresol novolak-type epoxy resins, bisphenol A novolak-type epoxy resins, epoxy resins each having a butadiene structure, phenolaralkyl-type epoxy resins, epoxy resins each having a dicyclopentadiene structure, diglycidyl-etherated products of bisphenol, diglycidyl-etherated products of naphthalenediol, glycidyl-etherated products of phenols and diglycidyl-etherated products of alcohols, and alkyl-substituted forms, halides and hydrogen adducts and the like of these epoxy resins. These may be used by one kind or in combination of two or more kinds.

Among these, from the viewpoints of retention of the high heat-resistance and low water content permeability of the resin composition, and the like, bisphenol A-type epoxy resins, bisphenol F-type epoxy resins, phenol novolak-type epoxy resins, biphenylaralkyl-type epoxy resins, phenolaralkyl-type epoxy resins, aromatic glycidylamine-type epoxy resins, epoxy resins having a dicyclopentadiene structure and the like are preferable.

Furthermore, the epoxy resin may be either a liquid or a solid, or both of a liquid and a solid may be used. As used herein, "liquid" and "solid" are the states of the epoxy resin at 25° C. In view of coating property, processability, tackiness and the like, it is preferable that 10 mass % or more of the entirety of the epoxy resin as used is a liquid.

Furthermore, in view of reactivity, the epoxy resin has an epoxy equivalent amount of preferably in the range of from 100 to 1,000, more preferably in the range of from 120 to 1,000. The epoxy equivalent amount herein is a gram number of a resin containing 1 gram equivalent amount of epoxy groups (g/eq), and is measured according to a method as prescribed in JIS K-7236.

The curing agent for the epoxy resin is not specifically limited as long as it has a function to cure epoxy resins, and from the viewpoint of suppression of the thermal deterioration of an element (specifically an organic EL element) in the curing treatment of the resin composition, the curing treatment of the resin composition is preferably conducted at preferably 140° C. or less, more preferably 120° C. or less, and the curing agent is preferably a curing agent having an action to cure the epoxy resin at such temperature region.

Specific examples include primary amine, secondary amine and tertiary amine-based curing agents, polyaminoamide-based curing agents, dicyandiamide, organic acid dihydrazides and the like, and among these, amine adduct-based compounds (Amicure PN-23, Amicure MY-24, Amicure PN-D, Amicure MY-D, Amicure PN-H, Amicure MY-H, Amicure PN-31, Amicure PN-40, Amicure PN-40J and the like (all of these are manufactured by Ajinomoto Fine-Techno Co., Inc.)), organic acid dihydrazides (Amicure VDH-J, Amicure UDH, Amicure LDH and the like (all of these are manufactured by Ajinomoto Fine-Techno Co., Inc.)) and the like are preferable in view of rapid curability. These may be used by one kind or in combination of two or more kinds.

The epoxy resin has an extremely fine low temperature curability, and the upper limit of the curing temperature is preferably 140° C. or less, more preferably 120° C. or less, further preferably 110° C. or less. On the other hand, from the viewpoint of ensuring of the tackiness of a cured product, the lower limit of the curing temperature is preferably 50° C. or more, more preferably 55° C. or more. Furthermore, the upper limit of the curing time is preferably 120 minutes or less, more preferably 90 minutes or less, further preferably 60 minutes or less. On the other hand, from the viewpoint of sure curing of a cured product, the lower limit of the curing time is preferably 20 minutes or more, more preferably 30 minutes or more. BY this way, the thermal deterioration of the organic EL element can be extremely decreased.

<<Use of Organic EL Element>>

Since the organic EL element of the present invention is a plane light-emitting body and of a two-side light emission type, it can be used as various light emission sources. Examples include, but are not limited to, methods of use utilizing the characteristic of a two-sided light emission-type such as lighting devices such as household lighting and in-car lighting, backlights for clocks and liquid crystals, lightings for signboard advertisement, light sources for traffic lights, light sources for optical memory media, light sources for electrophotographic copying machines, light sources for optical communication processors and light sources for light sensors.

Specifically, the organic EL element of the present invention may be used as a kind of lamp such as a lamp for lighting and a light source for exposing to light, or may be used as a projection device of a type in which an image is projected, or a display device (display) of a type in which a still image or an active image is directly and visually recognized. In this case, according to the upsizing of lighting devices and displays in recent years, the surface area of a light-emitting surface can be increased by joining light-emitting panels provided with the organic EL elements in a planar manner, so-called tiling.

The driving system in the case of use as a display device for video replay may be either a simple matrix (passive matrix) system or an active matrix system. Furthermore, it is possible to prepare a color or full-color display device by using two or more kinds of the organic EL elements of the present invention having different colors of light emission.

EXAMPLES

The present invention will be specifically explained below with referring to Examples, but the present invention is not limited to these. In Examples, indication of "parts" or "." is used, and unless specifically mentioned, the indication represents "parts by mass" or "% by mass".

Example 1

[Preparation of Organic EL Element 101]
(Washing of Glass Substrate)

A glass substrate was washed in a clean room of Class 10000 and a clean booth of Class 100, respectively. A detergent for washing semiconductors and ultrapure water (18 MΩ or more, total organic carbon (TOC): lower than 10 ppb) were used as washing solvents, and a ultrasonic washing machine and a UV washing machine were used.

(Formation of First Transparent Electrode)

ITO (indium oxide-tin (Indiumu Tin Oxide: ITO)) was formed into a film having a thickness of 150 nm by a sputtering process on a flexible thin film glass substrate having a thickness of 70 μm, and patterning was conducted by a photolithographic process, whereby a first transparent electrode was formed. The pattern was a pattern having a light emitting surface area of 50 mm square.

(Formation of Organic Light-Emitting Layer)
(Formation of Hole Transport Layer)

Prior to the application of an application liquid for forming a hole transport layer, the glass substrate on which the first transparent electrode had been formed was subjected to a washing surface modification treatment by using a low pressure mercury lamp having a wavelength of 184.9 nm at an irradiation intensity of 15 mW/cm$^2$ and a distance of 10 mm. A charge elimination treatment was conducted by using a static eliminator by a faint X-ray.

An application liquid for forming a hole transport layer shown below was applied onto the first transparent electrode of the glass substrate on which the first transparent electrode had been formed, under an environment at 25° C. and a relative humidity of 50% RH by using a spin coater, and drying and thermal treatments were conducted under the following conditions, whereby a hole transport layer was formed. The application liquid for forming a hole transport layer was applied so that the thickness after the drying became 50 nm.

<Preparation of Application Liquid for Forming Hole Transport Layer>

A solution in which polyethylene dioxythiophene/polystyrene sulfonate (PEDOT/PSS, Bytron P AI 4083 manufactured by Bayer) had been diluted with 65% of pure water and 5% of methanol was prepared as an application liquid for forming a hole transport layer.

<Conditions for Drying and Thermal Treatments>

The application liquid for forming a hole transport layer was applied, and the solvents were removed at a height of 100 mm, an ejection wind velocity of 1 m/s, a transversal wind velocity distribution of 5% and a temperature of 100° C. toward the film-formed surface. Subsequently, a thermal treatment of a rear-surface heat transfer system was conducted by using a thermal treatment device at a temperature of 150° C., whereby a hole transport layer was formed.

(Formation of Light-Emitting Layer)

An application liquid for forming a white light-emitting layer shown below was applied by a spin coater onto the hole transport layer formed above under the following conditions, and drying and thermal treatments were conducted under the following conditions, whereby a light-emitting layer was formed. The application liquid for forming a white light-emitting layer was applied so that the thickness after the drying became 40 nm.

<Application Liquid for Forming White Light-Emitting Layer>

An application liquid for forming a white light-emitting layer was prepared by dissolving 1.0 g of the compound represented by the following chemical formula H-A as a host material, 100 mg of the compound represented by the following chemical formula D-A as a dopant material, 0.2 mg of the compound represented by the following chemical formula D-B as a dopant material and 0.2 mg of the compound represented by the following chemical formula D-C as a dopant material in 100 g of toluene.

[Chemical Formula 24]

H-A

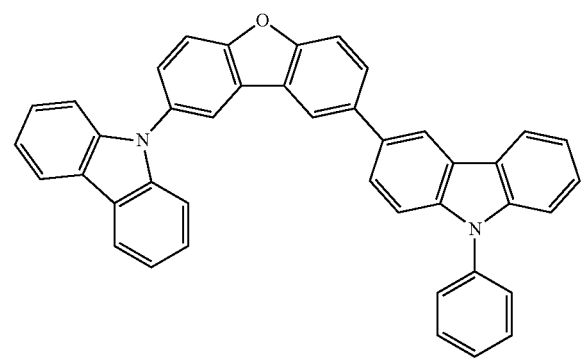

-continued

D-A

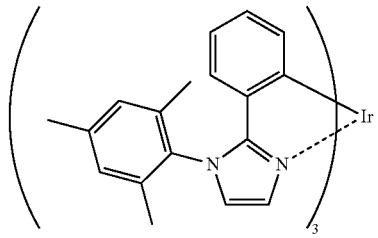

D-B

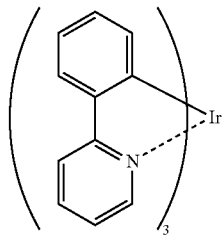

D-C

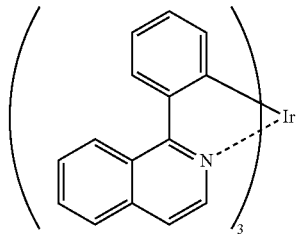

<Conditions for Application>

The application step was conducted under an atmosphere of a nitrogen gas concentration of 99% or more at an application temperature of 25° C.

<Conditions for Drying and Thermal Treatments>

The application liquid for forming a white light-emitting layer was applied, and the solvents were removed at a height of 100 mm, an ejection wind velocity of 1 m/s, a transversal wind velocity distribution of 5% and a temperature of 60° C. toward the film-formed surface. Subsequently, a thermal treatment was conducted at a temperature of 130° C., whereby a light-emitting layer was formed.

(Formation of Electron Transport Layer)

The application liquid for forming an electron transport layer shown below was applied by a spin coater onto the light-emitting layer formed above under the following conditions, and subjected to drying and thermal treatments under the following conditions, whereby an electron transport layer was formed. The application liquid for forming an electron transport layer was applied so that the thickness after the drying became 30 nm.

<Conditions for Application>

The application step was conducted under an atmosphere of a nitrogen gas concentration of 99% or more, and an application temperature of the application liquid for forming an electron transport layer of 25° C.

<Application Liquid for Forming Electron Transport Layer>

For the electron transport layer, an application liquid for forming an electron transport layer was prepared by dissolving the compound represented by the following chemical formula E-A in 2,2,3,3-tetrafluoro-1-propanol to give a 0.5% by mass solution.

[Chemical Formula 25]

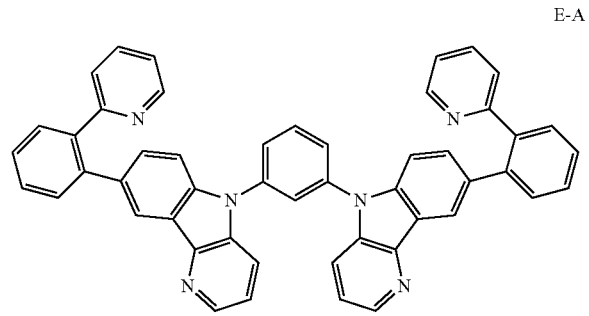

E-A

<Conditions for Drying and Thermal Treatments>

The application liquid for forming an electron transport layer was applied, and the solvent was removed at a height of 100 mm, an ejection wind velocity of 1 m/s, a transversal wind velocity distribution of 5% and a temperature of 60° C. toward the film-formed surface. Subsequently, a thermal treatment was conducted on a thermal treatment part at a temperature of 200° C., whereby an electron transport layer was formed.

(Formation of Electron Injection Layer)

An electron injection layer was formed on the electron transport layer formed above. Firstly, the substrate was put into a pressure reduction chamber, and the pressure was reduced to $5 \times 10^{-4}$ Pa. Cesium fluoride, which had been prepared in a deposition boat made of tantalum in a vacuum chamber in advance, was heated, whereby an electron injection layer having a thickness of 3 nm was formed.

(Formation of Second Transparent Electrode)

A second transparent electrode having a thickness of 150 nm was stacked on the part that was on the electron injection layer formed above, except the part that was to be an extraction electrode of the first transparent electrode, by conducting mask pattern film formation so as to give a light emitting surface area of 50 mm square, under a vacuum of $5 \times 10^{-4}$ Pa using ITO as a material for forming the second transparent electrode, so as to have an extraction electrode, by a deposition process.

(Cutting)

Each laminate in which the layers up to the second transparent electrode had been formed as above was transferred again to a nitrogen atmosphere, and cut into a predetermined size by using ultraviolet laser, whereby an organic EL element was prepared.

(Connection of Electrode Lead)

A flexible printing substrate (base film: polyimide 12.5 µm, rolled copper foil 18 µm, cover lay: polyimide 12.5 µm, surface treatment NiAu plating) was connected to the prepared organic EL element by using an anisotropic electro-conductive film DP3232S9 manufactured by Sony Chemical & Information Device Corporation.

Press bonding was conducted under conditions for press bonding of a temperature of 170° C. (an ACF temperature measured by separately using a thermocouple of 140° C.), a pressure of 2 MPa and 10 seconds.

(Sealing)

The organic EL element prepared as above was covered with a transparent sealing substrate formed of a box-shaped thick film glass substrate having no flexibility and having thickness of 300 µm, and an adhesive (sealing material) was filled in between the end part of the transparent sealing substrate 105 and the transparent substrate 110 in the state that the organic EL element and the sealing material had a hollow part therebetween. An epoxy-based photocurable adhesive (Luxtrack LC0629B manufactured by Toagosei Co., Ltd.) was used as the adhesive. The adhesive filled in between the transparent sealing substrate 105 and the transparent substrate 110 was irradiated with UV ray from the side of the thick film glass substrate (sealing material) to cure the adhesive to seal the organic EL element, whereby the organic EL element 101 was prepared.

The ratio a:b when the distance between the first transparent electrode and the light-emitting center of the organic light-emitting layer was deemed as a and the distance between the second transparent electrode and the light-emitting center of the organic light-emitting layer was deemed as b, of the organic EL element 101, was 1:1.

[Preparation of Organic EL Element 102]

(Preparation of Transparent Substrate)

An application liquid containing a polysilazane was applied onto a polyester film having a width of 500 mm and a thickness of 125 µm, whose two sides had undergone an easy adhesion treatment (a quite low thermal shrinking PET manufactured by Teijin DuPont Films Japan Ltd.), a modification treatment was then conducted by irradiating with vacuum ultraviolet ray, and a gas barrier layer was provided, whereby a flexible transparent substrate was prepared. This is described as PHPS barrier in the table.

(Preparation of Polysilazane-Containing Application Liquid)

A dibutyl ether solution containing 20% by mass of catalyst-free perhydropolysilazane (Aquamica (registered trademark) NN120-20 manufactured by AZ Electronic Materials) and a dibutyl ether solution containing 20% by mass of perhydropolysilazane containing 5% by mass of an amine catalyst (N,N,N',N'-tetramethyl-1,6-diaminohexane (TMDAH)) (Aquamica (registered trademark) NAX120-20 manufactured by AZ Electronic Materials) were mixed at a ratio of 4:1, and an application liquid is prepared by further diluting the mixture with a solvent in which dibutyl ether and 2,2,4-trimethylpentane had been mixed so that the mass ratio became 65:35, so that the solid content of the application liquid became 5% by mass.

The application liquid obtained above was subjected to film formation on the above-mentioned PET substrate by using a spin coater so as to give a thickness of 300 nm, left for 2 minutes, and subjected to a thermal treatment on a hot plate at 80° C. for 1 minute, whereby a polysilazane coating was formed.

After the polysilazane coating was formed, polysilazane coating was subjected to a vacuum UV irradiation treatment at 6,000 mJ/cm$^2$ according to the following method, whereby a gas barrier layer was formed.

<Conditions for Irradiation of Vacuum UV, and Measurement of Irradiation Energy>

Figure 2:
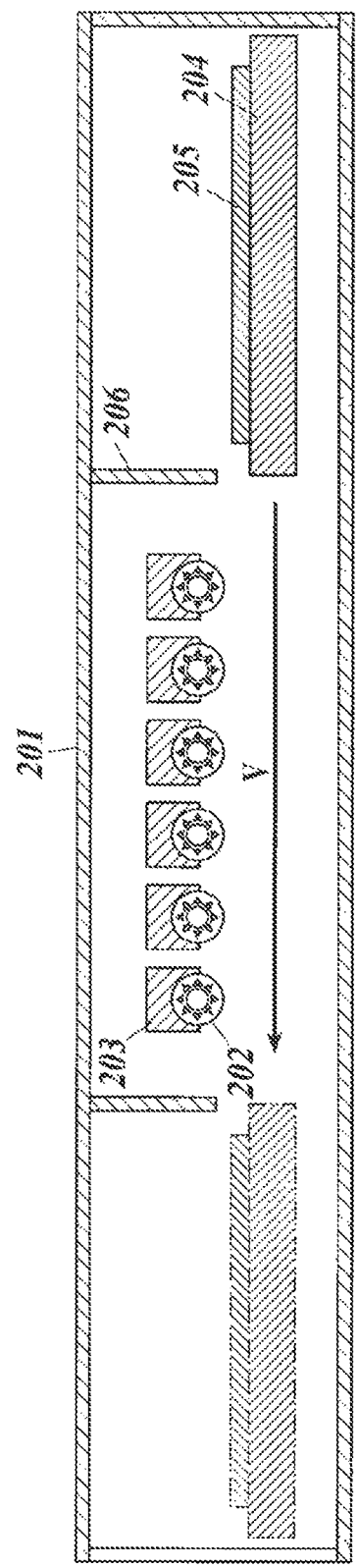
FIG. 2 is a schematic drawing showing an example of a vacuum ultraviolet irradiation device used for the formation of the smooth layer in the present invention.

The vacuum UV irradiation was conducted by using the device as shown by a schematic drawing in FIG. 2.

In FIG. 2, reference numeral 201 denotes a device chamber, and the oxygen concentration can be maintained at a predetermined concentration by supplying suitable amounts of nitrogen and oxygen to the inside from gas supply inlets, which are not illustrated, and ejecting the gases from gas ejection outlets, which are not illustrated, to thereby substantially remove the water vapor from the inside of the chamber. Reference numeral 202 denotes an Xe excimer lamp having a double tube structure that irradiates vacuum ultraviolet ray at 172 nm, and reference numeral 203 denotes a holder for an excimer lamp which also serves as an external electrode. Reference numeral 204 denotes a sample stage. The sample stage 204 can transfer in a reciprocation manner at a predetermined velocity horizontally in the device chamber 201 by a transfer means, which is not illustrated. Furthermore, the sample stage 204 can be maintained at a predetermined temperature by a heating means, which is not illustrated. Reference numeral 205 denotes a sample on which a polysilazane coating has been formed. The height of the sample stage is adjusted so that the shortest distance between the surface of the application layer of the sample and the surface of the excimer lamp tube become 3 mm when the sample stage transfers horizontally. Reference numeral 206 denotes a light blocking plate, and prevents the application layer of the sample from being irradiated with vacuum ultraviolet ray during the aging of the Xe excimer lamp 202.

The energy irradiated on the vacuum coating surface in the UV irradiation step was measured by using a ultraviolet integral light counter: C8026/H8025 UV POWER METER manufactured by Hamamatsu Photonics K.K., and using a sensor head of 172 nm. In the measurement, the sensor head was installed on the center of the sample stage 204 so that the shortest distance between the surface of the Xe excimer lamp tube and the measurement surface of the sensor head became 3 mm, and nitrogen and oxygen were supplied so that the atmosphere in the device chamber 201 had an identical oxygen concentration to that in the vacuum UV irradiation step, and the measurement was conducted by transferring the sample stage 204 at a velocity of 0.5 m/min (V in FIG. 2). Prior to the measurement, in order to stabilize the illuminance of the Xe excimer lamp 12, an aging time for 10 minutes was provided after the lighting of the Xe excimer lamp, and the measurement was then initiated by transferring the sample stage.

Based on the irradiation energy obtained by this measurement, the irradiation energy was adjusted to be 6,000 mJ/cm$^2$ by adjusting the transfer velocity of the sample stage. The vacuum UV irradiation was conducted after the aging for 10 minutes in a similar manner to that in the measurement of the irradiation energy.

Layers up to the second transparent electrode were stacked in a similar manner to that for the organic EL element 101 on the prepared transparent substrate with a gas barrier layer, and the transparent substrate was cut and connected to an electrode lead.

Subsequently, an epoxy-based photocurable adhesive (Luxtrack LC0629B manufactured by Toagosei Co., Ltd.) was applied onto a thin film glass substrate having a thickness of 70 μm as a transparent sealing substrate, and laminate sealing was conducted so that the organic EL element obtained above and the sealing substrate did not have a hollow part therebetween and that the laminate sealing covered the entire surface of the organic EL element. The adhesive was cured by irradiating with UV ray from the side of the glass substrate (sealing material), whereby an organic EL element 102 was prepared.

[Preparation of Organic EL Element 103]

An organic EL element 103 was prepared in a similar manner to that of the preparation of the organic EL element 102, except that the above-mentioned thin film glass having a thickness of 70 μm was used as the transparent substrate, and the above-mentioned PET substrate with a gas barrier layer was used as the transparent sealing substrate.

The attaching of the transparent sealing substrate using the PET substrate with a gas barrier layer was conducted by using an epoxy-based thermal curable adhesive (Elefan CS manufactured by Tomoegawa Co., Ltd.) as an adhesive, by vacuum pressing toward the organic EL element in a glove box in which the oxygen concentration was 10 ppm or less and the water content concentration was 10 ppm or less, under conditions of 80° C., a load of 0.04 Mpa, aspiration under a reduced pressure (1×10$^{-3}$ Mpa or less) for 20 seconds, and pressing for 20 seconds, so that the gas barrier layer of the above-mentioned PET substrate with the gas barrier layer was put onto the side of the element.

Subsequently, the adhesive layer was thermally cured by heating in the glove box on a hot plate of 110° C. for 30 minutes.

[Preparation of Organic EL Element 104]

An organic EL element 104 was prepared in a similar manner to that of the preparation of the organic EL element 103, except that the above-mentioned PET substrate with a gas barrier layer was used for both of the transparent substrate and the transparent sealing substrate.

[Preparation of Organic EL Element 105]

Using the above-mentioned PET substrate with a gas barrier layer, which was used in the preparation of the organic EL element 104, as a transparent substrate, a first transparent electrode having a single layer structure was formed on the gas barrier layer.

Firstly, the PET substrate with a gas barrier layer was set on a substrate holder, the following compound A was put into a resistant heating boat made of tantalum, and these substrate holder and heating boat were attached to a first vacuum bath of a vacuum deposition device.

Under this state, the pressure in the first vacuum bath was firstly reduced to 4×10$^{-4}$ Pa, and the heating boat containing compound A was heated by energization, whereby a primer layer, which is a transparent functional layer formed of compound A having a layer thickness of 25 nm, was disposed on the substrate at a deposition velocity of 0.1 nm/min.

Secondly, the transparent substrate on which the primer layer had been formed was transferred to a second vacuum bath in the original vacuum, the pressure in the second vacuum bath was reduced to 4×10$^{-4}$ Pa, and a film of ITO was formed so as to have a film thickness of 150 nm in the state that the flow amounts of Ar gas and O$_2$ gas were constant, by using a DC magnetron sputter device, whereby a first transparent electrode composed of a stacked structure of the primer layer and the metal layer formed thereon was prepared.

[Chemical Formula 26]

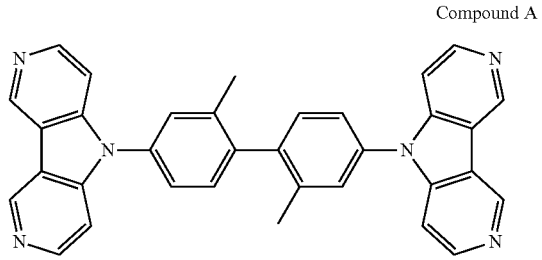

Compound A

The above-mentioned organic light-emitting layers were sequentially stacked on the first transparent electrode of the first transparent electrode and the PET substrate with a gas barrier layer as prepared.

The above-mentioned transparent substrate on which the layers up to the organic light-emitting layer had been formed was then transferred to a third vacuum bath in the original vacuum, the pressure in the third vacuum bath was reduced to 4×10⁻⁴ Pa, and a film of ITO was formed so as to have a film thickness of 150 nm in the state that the flow amounts of Ar gas and $O_2$ gas were constant, by using a DC magnetron sputter device, whereby a second transparent electrode was prepared. Furthermore, after the formation of the second transparent electrode, a film of compound A was formed thereon by resistant heating deposition as an electrode protective layer at a layer thickness of 50 nm.

Subsequently, using the above-mentioned PET substrate with a gas barrier layer as it is as a transparent sealing substrate in a similar manner to that for the organic EL element 103, laminate sealing was conducted through an adhesive layer using the above-mentioned epoxy-based thermal curable adhesive, whereby an organic EL element 105 was prepared.

[Preparation of Organic EL Element 106]

Using the above-mentioned PET substrate with a gas barrier layer, which was used in the preparation of the organic EL element 105, as a transparent substrate, a first transparent electrode having a single layer structure was prepared on the gas barrier layer as follows.

Firstly, the PET substrate with a gas barrier layer was fixed on a substrate holder of a vacuum deposition device, and the holder was attached to a vacuum bath of the vacuum deposition device. Silver (Ag) was put into a resistant heating boat made of tungsten, and the boat was attached to the inside of the vacuum bath. The pressure in the vacuum bath was then reduced to 4×10⁻⁴ Pa, and the resistant heating boat was heated by energization, whereby a first transparent electrode having a single layer structure made of silver was formed by resistant heating deposition. The thus-formed first transparent electrode formed of silver (Ag) had a layer thickness of 10 nm.

The above-mentioned organic light-emitting layer was stacked on the prepared first transparent electrode and the first transparent electrode of the PET substrate with a gas barrier layer.

A second transparent formed of silver (Ag) having a layer thickness 10 nm was then stacked on the above-mentioned organic light-emitting layer in a similar manner to that for the first transparent electrode, and laminate sealing was further conducted by using the above-mentioned PET substrate with a gas barrier layer as it is as a transparent sealing substrate in a similar manner to that for the organic EL element 105, whereby an organic EL element 106 was prepared.

[Preparation of Organic EL Element 107]

A primer layer containing the above-mentioned compound A was formed in a similar manner to that for preparation of the organic EL element 105. Subsequently, silver (Ag) was put in a resistant heating boat made of tungsten in a similar manner to that for the organic EL element 106, the pressure in a vacuum bath was reduced to 4×10⁻⁴ Pa, the resistant heating boat was heated by energization, whereby a first transparent electrode having a single layer structure formed of silver was formed by resistant heating deposition. The thus-formed first transparent electrode made of silver (Ag) had a layer thickness of 10 nm.

The above-mentioned organic light-emitting layers were sequentially stacked on the prepared first transparent electrode and the first transparent electrode and the PET substrate with a gas barrier layer as prepared.

Subsequently, a second transparent electrode layer and an electrode protective layer were formed in a similar manner to that for the organic EL element 105. Thereafter, using the above-mentioned PET substrate with a gas barrier layer as it is as a transparent sealing substrate, laminate sealing was conducted through an adhesive layer using the above-mentioned epoxy-based thermal curable adhesive, whereby an organic EL element 107 was prepared.

[Preparation of Organic EL Element 108]

An organic EL element 108 was prepared in a similar manner to that of the preparation of the organic EL element 107, except that the first transparent electrode and second transparent electrode were formed by co-depositing the metals used for the electrodes so as to give an atomic number ratio of silver (Ag) and aluminum (Al) of 98:2.

The organic EL elements 101 to 108 as prepared were evaluated as follows.

<<Evaluation>>

[Measurement of Electrical Power Efficiency]

Using a spectroscopic radiation luminance meter CS-1000 (manufactured by Konica Minolta, Inc.), the front surface luminance and luminance angle dependency of each organic EL element were measured by every 5° up to the angles of ±80°, and the electrical power efficiencies in terms of 1,000 cd/m² of front surface luminance were respectively obtained on the side of the first transparent electrode (the side of the substrate) and the side of the second transparent electrode (the side of the sealing).

The values were represented by relative values with deeming the value of the organic EL element 104 as 100. A larger value of the electrical power efficiency shows being more excellent.

[Color Shift]

Using a spectroscopic radiation luminance meter CS-1000 (manufactured by Konica Minolta), the angle dependency of the chromaticity of each organic EL element was measured on the front surface and by every 5 up to the angles of ±80, and the values of color shift ΔE at which ΔE from front surface became the maximal were obtained from the following formula on the side of the first transparent electrode (the side of the substrate), and the side of the second transparent electrode (the side of the sealing), respectively. In the following formula, x and y are chromaticities x and y in the CIE1931 colorimetric system.

$$\Delta E = (\Delta x^2 + \Delta y^2)^{1/2}$$

The ΔExy measured as above is represented by a relative value with deeming the measured value on the side of the first transparent electrode of the organic EL element 104 as 100, and a smaller value indicates that the color shift due to the change in viewing angle is smaller.

The evaluation results are shown in the following Table 3.

TABLE 3

| Organic EL element No. | Transparent substrate | Transparent functional layer (primer layer) | First transparent electrode Material for metal layer | First transparent electrode Layer thickness of metal layer (nm) | Second transparent electrode Material for metal layer | Second transparent electrode Layer thickness of metal layer (nm) | Transparent functional layer (electrode protective layer) | Transparent sealing substrate |
|---|---|---|---|---|---|---|---|---|
| 101 | Thin film glass | None | ITO | 150 | ITO | 150 | None | Thick film glass |
| 102 | PHPS BARRIER | None | ITO | 150 | ITO | 150 | None | Thin film glass |
| 103 | Thin film glass | None | ITO | 150 | ITO | 150 | None | PHPS BARRIER |
| 104 | PHPS BARRIER | None | ITO | 150 | ITO | 150 | None | PHPS BARRIER |
| 105 | PHPS BARRIER | Compound A | ITO | 150 | ITO | 150 | Compound A | PHPS BARRIER |
| 106 | PHPS BARRIER | None | Ag | 10 | Ag | 10 | None | PHPS BARRIER |
| 107 | PHPS BARRIER | Compound A | Ag | 10 | Ag | 10 | Compound A | PHPS BARRIER |
| 108 | PHPS BARRIER | Compound A | Ag:Al | 10 | Ag:Al | 10 | Compound A | PHPS BARRIER |

| Organic EL element No. | Method for sealing | a:b | Side of first transparent electrode Relative value of electrical power efficiency (lm/W) | Side of first transparent electrode Relative value of color shift Δ Exy | Side of second transparent electrode Relative value of electrical power efficiency (lm/W) | Side of second transparent electrode Relative value of color shift Δ Exy | Note |
|---|---|---|---|---|---|---|---|
| 101 | Hollow | 1:1 | 45 | 143 | 12 | Measurement was impossible | Comparative Example |
| 102 | Laminate sealing | 1:1 | 106 | 132 | 92 | 121 | Comparative Example |
| 103 | Laminate sealing | 1:1 | 96 | 105 | 103 | 112 | Comparative Example |
| 104 | Laminate sealing | 1:1 | 100 | 100 | 97 | 98 | Present Invention |
| 105 | Laminate sealing | 1:1 | 120 | 77 | 117 | 72 | Present Invention |
| 106 | Laminate sealing | 1:1 | 118 | 83 | 113 | 79 | Present Invention |
| 107 | Laminate sealing | 1:1 | 139 | 72 | 134 | 72 | Present Invention |
| 108 | Laminate sealing | 1:1 | 129 | 75 | 130 | 76 | Present Invention |

It is understood from Table 3 that the organic EL elements 103 to 108 of the present invention had high electrical power efficiencies and small relative values of color shift on the side of the first transparent electrode and the side of the second transparent electrode. Specifically, the effects were high in the organic EL elements 106 to 108 using silver (Ag) as the electrodes. Furthermore, it is obvious that the organic EL elements 107 and 108, which contained an organic compound having nitrogen atom(s) as the primer layer for the silver electrode, show excellent properties.

Example 2

In the organic EL elements 104, 105, 106 and 107 prepared in Example 1, the values of the ratio a:b when the distance between the first transparent electrode and the light-emitting center of the organic light-emitting layer was deemed as a and the distance between the second transparent electrode and the light-emitting center of the organic light-emitting layer was deemed as b were changed as described in the following Table 4, by suitably changing the layer thicknesses of the respective layers constituting the organic light-emitting layer, whereby organic EL elements 204, 205, 206 and 207 respectively corresponding to the above-mentioned organic EL elements were prepared.

The thus-prepared organic EL elements 104, 105, 106 and 107 and the organic EL elements 204, 205, 206 and 207 were evaluated in a similar manner to that in Example 1, and the results are shown in Table 4.

TABLE 4

| Organic EL element No. | Transparent substrate | Transparent functional layer (primer layer) | First transparent electrode | | Second transparent electrode | | Transparent functional layer (electrode protective layer) | Transparent sealing substrate |
|---|---|---|---|---|---|---|---|---|
| | | | Material for metal layer | Layer thickness of metal layer (nm) | Material for metal layer | Layer thickness of metal layer (nm) | | |
| 104 | PHPS BARRIER | None | ITO | 150 | ITO | 150 | None | PHPS BARRIER |
| 204 | PHPS BARRIER | None | ITO | 150 | ITO | 150 | None | PHPS BARRIER |
| 105 | PHPS BARRIER | Compound A | ITO | 150 | ITO | 150 | Compound A | PHPS BARRIER |
| 205 | PHPS BARRIER | Compound A | ITO | 150 | ITO | 150 | Compound A | PHPS BARRIER |
| 106 | PHPS BARRIER | None | Ag | 10 | Ag | 10 | None | PHPS BARRIER |
| 206 | PHPS BARRIER | None | Ag | 10 | Ag | 10 | None | PHPS BARRIER |
| 107 | PHPS BARRIER | Compound A | Ag | 10 | Ag | 10 | Compound A | PHPS BARRIER |
| 207 | PHPS BARRIER | Compound A | Ag | 10 | Ag | 10 | Compound A | PHPS BARRIER |

| Organic EL element No. | Method for sealing | a:b | Side of first transparent electrode | | Side of second transparent electrode | | Note |
|---|---|---|---|---|---|---|---|
| | | | Relative value of electrical power efficiency (lm/W) | Relative value of color shift $\Delta$ Exy | Relative value of electrical power efficiency (lm/W) | Relative value of color shift $\Delta$ Exy | |
| 104 | Laminate sealing | 1:1 | 100 | 100 | 97 | 98 | Present Example |
| 204 | Laminate sealing | 3:2 | 100 | 102 | 97 | 101 | Present Invention |
| 105 | Laminate sealing | 1:1 | 120 | 77 | 117 | 72 | Present Invention |
| 205 | Laminate sealing | 2:3 | 119 | 79 | 122 | 73 | Present Invention |
| 106 | Laminate sealing | 1:1 | 118 | 83 | 113 | 79 | Present Invention |
| 206 | Laminate sealing | 5:3 | 117 | 84 | 115 | 81 | Present Invention |
| 107 | Laminate sealing | 1:1 | 139 | 72 | 134 | 72 | Present Invention |
| 207 | Laminate sealing | 1:2 | 135 | 76 | 129 | 73 | Present Invention |

It is understood from Table 4 that, in the organic EL elements 104, 105, 106 and 107 and the organic EL elements 204, 205 and 206 in which the above-mentioned ratio a:b was in the range of from 3:5 to 5:3, the difference in light distribution properties on the two sides was small even in the case when the layer thickness of the organic light-emitting layer deviated and the light-emitting center transferred.

Example 3

In the organic EL elements 106, 107 and 108 prepared in Example 1, the layer thickness of the metal layer of the constitutional first transparent electrode, and the layer thickness of the metal layer of the second transparent electrode were changed as shown in the following Table 5, whereby organic EL elements 306, 316, 307 and 308 respectively corresponding to the above-mentioned organic EL elements were prepared.

The prepared organic EL elements 106, 107 and 108 and the organic EL elements 306, 316, 307 and 308 were evaluated in a similar manner to that in Example 1, and the results are shown in Table 5.

TABLE 5

| Organic EL element No. | Transparent substrate | Transparent functional layer (primer layer) | First transparent electrode | | Second transparent electrode | | Transparent functional layer (electrode protective layer) | Transparent sealing substrate |
|---|---|---|---|---|---|---|---|---|
| | | | Material for metal layer | Layer thickness of metal layer (nm) | Material for metal layer | Layer thickness of metal layer (nm) | | |
| 106 | PHPS BARRIER | None | Ag | 10 | Ag | 10 | None | PHPS BARRIER |
| 306 | PHPS BARRIER | None | Ag | 8 | Ag | 12 | None | PHPS BARRIER |
| 316 | PHPS BARRIER | None | Ag | 18 | Ag | 9 | None | PHPS BARRIER |
| 107 | PHPS BARRIER | Compound A | Ag | 10 | Ag | 10 | Compound A | PHPS BARRIER |
| 307 | PHPS BARRIER | Compound A | Ag | 20 | Ag | 7 | Compound A | PHPS BARRIER |
| 108 | PHPS BARRIER | Compound A | Ag:Al | 10 | Ag:Al | 10 | Compound A | PHPS BARRIER |
| 308 | PHPS BARRIER | Compound A | Ag:Al | 7 | Ag:Al | 15 | Compound A | PHPS BARRIER |

| Organic EL element No. | Method for sealing | a:b | Side of first transparent electrode | | Side of second transparent electrode | | Note |
|---|---|---|---|---|---|---|---|
| | | | Relative value of electrical power efficiency (lm/W) | Relative value of color shift Δ Exy | Relative value of electrical power efficiency (lm/W) | Relative value of color shift Δ Exy | |
| 106 | Laminate sealing | 1:1 | 118 | 83 | 113 | 79 | Present Invention |
| 306 | Laminate sealing | 1:1 | 168 | 83 | 73 | 79 | Present Invention |
| 316 | Laminate sealing | 1:1 | 44 | 81 | 132 | 84 | Present Invention |
| 107 | Laminate sealing | 1:1 | 139 | 72 | 134 | 72 | Present Invention |
| 307 | Laminate sealing | 1:1 | 36 | 76 | 212 | 73 | Present Invention |
| 108 | Laminate sealing | 1:1 | 129 | 75 | 130 | 76 | Present Invention |
| 308 | Laminate sealing | 1:1 | 151 | 79 | 67 | 80 | Present Invention |

It is understood from Table 5 that the light distribution properties on the side of the first transparent electrode and the side of the second transparent electrode can be freely controlled while maintaining the color shift small, by suitably changing the layer thicknesses of the silver (Ag) layers of the first transparent electrode and the second transparent electrode. By this way, it can be expected that the freeness of designing of a two-side light distribution type organic EL element is significantly improved.

INDUSTRIAL APPLICABILITY

The organic electroluminescence element of the present invention is a two-side light-emitting transparent organic electroluminescence element, has flexibility, has a small viewing angle dependence of chromaticity, and can easily adjust the light-emission balance of the two sides, and thus is preferably used in image display devices that can be observed from two sides and illumination devices that are rich in design.

REFERENCE SIGNS LIST

100: Organic EL element
101: First transparent electrode
101a: Primer layer
101b: Electrode layer
102: Second transparent electrode (counter electrode)
103: Organic light-emitting layer
103a: Hole injection layer
103b: Hole transport layer
103c: Light-emitting layer
103d: Electron transport layer
103e: Electron injection layer
104: Electrode protective layer
105: Transparent sealing substrate
110: Transparent substrate
h: Emitted light

The invention claimed is:

1. An organic electroluminescence element comprising at least a transparent substrate, a first transparent electrode, an organic light-emitting layer, a second transparent electrode, first and second transparent functional layers, and a transparent sealing substrate,
    wherein both of the first and second transparent functional layers comprise an organic compound, the first transparent functional layer is disposed between the transparent substrate and the first transparent electrode, and the second transparent functional layer is disposed between the second transparent electrode and the transparent sealing substrate, the first transparent functional layer is a primer layer containing an organic compound having at least one kind of atom selected from a nitrogen atom and a sulfur atom, both of the transparent substrate and the transparent sealing substrate have flexibility and comprise material(s) selected from an identical group of materials, and the first transparent electrode and the second transparent electrode comprise silver or an alloy containing silver as a major component, and the major component accounts for 80 mass % or more of each electrode.

2. The organic electroluminescence element according to claim 1, wherein the second transparent functional layer an electrode protective layer.

3. The organic electroluminescence element according to claim 1, wherein the layer thicknesses of the first transparent electrode and the second transparent electrode are each in the range of from 5 to 30 nm.

4. The organic electroluminescence element according to claim 1, wherein the entirety of the first transparent electrode, the organic light-emitting layer, the second transparent electrode, and the first and second transparent functional layers disposed on the transparent substrate is sealed by lamination by the transparent sealing substrate.

5. The organic electroluminescence element according to claim 1, wherein when the distance between the first transparent electrode and the light-emitting center of the organic light-emitting layer is deemed as a and the distance between the second transparent electrode and the light-emitting center of the organic light-emitting layer is deemed as b, the ratio a:b is in the range of from 3:5 to 5:3.

6. The organic electroluminescence element according to claim 1, wherein the organic compound in the primer layer comprises at least one selected from the group consisting of a nitrogen-containing heterocyclic compound, a phenyl group-substituted amine compound, a polymer having nitrogen atoms or sulfur atoms, and an organic compound having a sulfide bond, a disulfide bond, a mercapto group, a sulfone group, or a thiocarbonyl bond.

7. The organic electroluminescence element according to claim 6, wherein the layer thicknesses of the first transparent electrode and the second transparent electrode are each in the range of from 5 to 30 nm.

8. The organic electroluminescence element according to claim 6, wherein the entirety of the first transparent electrode, the organic light-emitting layer, the second transparent electrode, and the first and second transparent functional layers disposed on the transparent substrate is sealed by lamination by the transparent sealing substrate.

9. The organic electroluminescence element according to claim 6, wherein when the distance between the first transparent electrode and the light-emitting center of the organic Tight-emitting layer is deemed as a and the distance between the second transparent electrode and the light-emitting center of the organic light-emitting layer is deemed as b, the ratio a:b is in the range of from 3:5 to 5:3.

10. The organic electroluminescence element according to claim 2, wherein the layer thicknesses of the first transparent electrode and the second transparent electrode are each in the range of from 5 to 30 nm.

11. The organic electroluminescence element according to claim 2, wherein the entirety of the first transparent electrode, the organic light-emitting layer, the second transparent electrode, and the first and second transparent functional layers disposed on the transparent substrate is sealed by lamination by the transparent sealing substrate.

12. The organic electroluminescence element according to claim 2, wherein when the distance between the first transparent electrode and the light-emitting center of the organic light-emitting layer is deemed as a and the distance between the second transparent electrode and the light-emitting center of the organic light-emitting layer is deemed as b, the ratio a:b is in the range of from 3:5 to 5:3.

13. The organic electroluminescence element according to claim 1, wherein both of the transparent substrate and the transparent sealing substrate comprise identical material(s), the first transparent electrode and the second transparent electrode comprise an identical material as the major component, and the identical material is the silver or the alloy containing silver.

14. The organic electroluminescence element according to claim 13, wherein the layer thicknesses of the first transparent electrode and the second transparent electrode are each in the range of from 5 to 30 nm.

15. The organic electroluminescence element according to claim 3, wherein the entirety of the first transparent electrode, the organic light-emitting layer, the second transparent electrode, and the first and second transparent functional layers disposed on the transparent substrate is sealed by lamination by the transparent sealing substrate.

16. The organic electroluminescence element according to claim 3, wherein when the distance between the first transparent electrode and the light-emitting center of the organic light-emitting layer is deemed as a and the distance between the second transparent electrode and the light-emitting center of the organic light-emitting layer is deemed as b, the ratio a:b is in the range of from 3:5 to 5:3.

17. The organic electroluminescence element according to claim 4, wherein when the distance between the first transparent electrode and the light-emitting center of the organic light-emitting layer is deemed as a and the distance between the second transparent electrode and the light-emitting center of the organic light-emitting layer is deemed as b, the ratio a:b is in the range of from 3:5 to 5:3.

* * * * *